(12) United States Patent
Manipatruni et al.

(10) Patent No.: US 11,069,609 B2
(45) Date of Patent: Jul. 20, 2021

(54) TECHNIQUES FOR FORMING VIAS AND OTHER INTERCONNECTS FOR INTEGRATED CIRCUIT STRUCTURES

(71) Applicant: INTEL CORPORATION, Santa Clara, CA (US)

(72) Inventors: Sasikanth Manipatruni, Hillsboro, OR (US); Jasmeet S. Chawla, Hillsboro, OR (US); Chia-Ching Lin, West Lafayette, IN (US); Dmitri E. Nikonov, Beaverton, OR (US); Ian A. Young, Portland, OR (US); Robert L. Bristol, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/647,691

(22) PCT Filed: Nov. 3, 2017

(86) PCT No.: PCT/US2017/059980
§ 371 (c)(1),
(2) Date: Mar. 16, 2020

(87) PCT Pub. No.: WO2019/089045
PCT Pub. Date: May 9, 2019

(65) Prior Publication Data
US 2020/0279805 A1    Sep. 3, 2020

(51) Int. Cl.
*H01L 23/522*    (2006.01)
*H01F 10/32*    (2006.01)
(Continued)

(52) U.S. Cl.
CPC ....... *H01L 23/5226* (2013.01); *H01F 10/329* (2013.01); *H01L 21/76816* (2013.01);
(Continued)

(58) Field of Classification Search
CPC ............ H01L 23/5226; H01L 23/5283; H01L 21/76816; H01L 21/76877; H01L 27/22; H01L 43/02; H01F 10/329
(Continued)

(56) References Cited

U.S. PATENT DOCUMENTS 10,074,594 B2 *    9/2018    Fang ................. H01L 21/76898
2013/0161628 A1    6/2013    Suzuki et al.
(Continued)

FOREIGN PATENT DOCUMENTS

WO    2016105436 A1    6/2016
WO    2019089045 A1    5/2019

OTHER PUBLICATIONS

International Search Report and Written Opinion dated Aug. 2, 2018 for International Patent Application No. PCT/US2017/059980, 10 pages.
(Continued)

*Primary Examiner* — Tu-Tu V Ho
(74) *Attorney, Agent, or Firm* — Schwabe, Williamson & Wyatt P.C.

(57) ABSTRACT

Techniques are disclosed for forming vias for integrated circuit structures. During an additive via formation process, a dielectric material is deposited, an etch stop layer is deposited, a checkerboard pattern is deposited on the etch stop layer, regions in the checkerboard pattern are removed where it is desired to have vias, openings are etched in the dielectric material through the removed regions, and the openings are filled with a first via material. This is then repeated for a second via material. During the subtractive via formation process, a first via material is deposited, an etch stop layer is deposited, a checkerboard pattern is deposited on the etch stop layer, regions in the checkerboard pattern are removed where it is not desired to have vias, openings
(Continued)

are etched in the first via material through the removed regions. This is then repeated for a second via material.

20 Claims, 11 Drawing Sheets

(51) Int. Cl.
| | |
|---|---|
| *H01L 21/768* | (2006.01) |
| *H01L 23/528* | (2006.01) |
| *H01L 27/22* | (2006.01) |
| *H01L 43/02* | (2006.01) |

(52) U.S. Cl.
CPC .... *H01L 21/76877* (2013.01); *H01L 23/5283* (2013.01); *H01L 27/22* (2013.01); *H01L 43/02* (2013.01)

(58) Field of Classification Search
USPC ........................................................ 257/774
See application file for complete search history.

(56) References Cited

U.S. PATENT DOCUMENTS

| | | |
|---|---|---|
| 2015/0243518 A1 | 8/2015 | deVilliers |
| 2015/0325515 A1 | 11/2015 | Zhu et al. |
| 2016/0190009 A1 | 6/2016 | Wallace et al. |
| 2016/0365276 A1 | 12/2016 | Wu et al. |

OTHER PUBLICATIONS

International Preliminary Report on Patentability dated May 5, 2020 for International Patent Application No. PCT/US2017/059980, 6 pages.

Manipatruni S. et al., "Spin-Orbit Logic with Magnetoelectric Nodes: A Scalable Change Mediated Nonvolatile Spintronic Logic", Components Research, Intel Corp., Hillsboro, OR 97124, USA, https://arvix.org/pdf/1512.05428v1.pdf, 2015, 22 pages.

Liu, L. et al., "Spin-Torque Ferromagnetic Resonance Induced by the Spin Hall Effect", Physical Review Letter, Jan. 2011, 4 pages.

Liu, L. et al., "Spin-Torque Switching with the Giant Spin Hall Effect of Tantalum", Retrieved on Jul. 13, 2020 from https://arxiv.org/abs/1203.2875.

Pai, C.F. et al., "Spin transfer torque devices utilizing the giant spin Hall effect of tungsten", Applied Physics Letters, Aug. 2012, 19 pages.

\* cited by examiner

TECHNIQUES FOR FORMING VIAS AND OTHER INTERCONNECTS FOR INTEGRATED CIRCUIT STRUCTURES

CROSS-REFERENCE TO RELATED APPLICATIONS

This patent application is a U.S. National Phase Application under 35 U.S.C. § 371 of International Application No. PCT/US2017/059980, filed on Nov. 3, 2017, the entire contents of which is hereby incorporated by reference herein.

BACKGROUND

In integrated circuit structures, vias can be formed by various techniques. Vias generally refer to connections between the layers in a physical integrated circuit that goes through the plane of one or more adjacent layers. The vias provide an interconnect between one component of the integrated circuit structure and another component or layer of the integrated circuit structure. As integrated circuit devices scale down to smaller and smaller sizes, via size likewise scales down to a very small size and fabrication of the vias can become challenging.

Figure 1A:
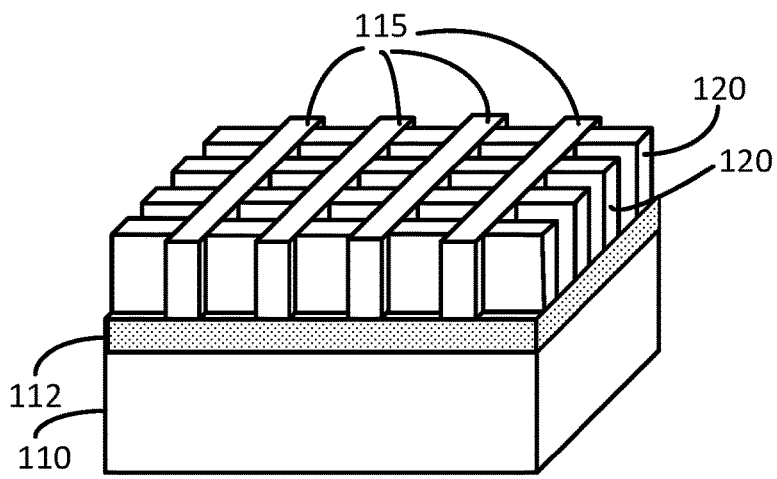
FIGS. 1A-1O illustrate example perspective and cross-sectional views of integrated circuit structures having vias formed by an additive via forming process, in accordance with an embodiment of the present disclosure.

These and other features of the present embodiments will be understood better by reading the following detailed description, taken together with the figures herein described. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming vias for integrated circuit structures. By applying a sacrificial layer in a checkerboard pattern, certain regions of the checkerboard pattern can be removed, and vias can be precisely formed through the removed regions. In accordance with an embodiment of the present disclosure, this checkerboard pattern can be applied in an additive via formation process, or in a subtractive via formation process. According to an additive process of the present disclosure, the checkerboard pattern is deposited on or above a layer of dielectric material, one or more regions of the checkerboard pattern are removed, and the dielectric can be etched through the removed regions to etch openings in the underlying layer of dielectric material, and the removed regions in the dielectric can then be filled with the appropriate via material (hence, the additive nature of the process). This additive process can be repeated for a second via material to provide two different via materials on a same via contact layer, as will be appreciated in light of the present disclosure. In a subtractive process of the present disclosure, the checkerboard pattern is deposited on or above a layer of a via material, one or more regions of the checkerboard pattern are removed, and the via material can be etched through the removed regions to thereby form vias of the first material (hence, the subtractive nature of the process). This subtractive process can be repeated for a second via material to provide two different via materials on a same via contact layer, as will be appreciated in light of the present disclosure. Providing two different via materials on a single via contact layer can be beneficial, for example, in spin orbit logic (SOL) devices or magneto-electric spin orbital (MESO) devices, which include both functional oxide material and a spin orbit coupling material on a same layer.

General Overview

Vias are generally formed by depositing a dielectric layer on or above a substrate, etching or otherwise forming an opening in the dielectric layer where it is desired to have a via, and then filling the opening in with the desired via material. However, as the size of the via scales down, for example to less than or equal to 7 nanometers (nm), the critical dimensions of the via itself can become less accurate, as well as the alignment of the via in the overall integrated circuit. These obstacles can be particularly challenging, for example, where more than one material is present for the vias in a same layer of the integrated circuit structure.

Thus, and in accordance with one or more embodiments of the present disclosure, techniques are provided for forming vias and other interconnects for integrated circuit structures. In a subtractive via formation process, a first layer comprising a first material is deposited on or above a substrate, an etch stop layer is deposited on the first layer, a first sacrificial checkerboard pattern layer is deposited on the etch stop layer, one or more regions of the first sacrificial layer are removed, and then areas of the first layer are etched through the regions of the first sacrificial layer to form vias of the first material. This process can then be repeated for a second via material to provide vias of a first material and vias of the second material on a same via contact layer of the integrated circuit structure. In an additive formation process according to the present disclosure, a dielectric material is deposited on or above a substrate, an etch stop layer is deposited on the dielectric material, a first sacrificial checkerboard pattern layer is deposited on the etch stop layer, one or more regions of the first sacrificial checkerboard pattern are removed, openings are etched in the dielectric material through the removed regions of the checkerboard pattern, and the openings are filled with a first via material, thereby forming vias of the first material at the precise target location. This process can then be repeated for the second via material to provide vias of the first material and vias of the second material at a same layer of the integrated circuit structure. According to either the additive or subtractive via formation process, one or more vias of a first material and one or more vias of a second material are formed on a same via contact layer at their proper position. The critical dimensions of the vias and proper alignment of the vias with respect to the overall integrated circuit are achieved using the sacrificial layer that is deposited in a checkerboard pattern, as will be appreciated in light of the present disclosure.

Methodology and Architecture—Additive Via Formation Process

According to an additive via formation process, a first layer of a dielectric material is deposited on or above a substrate, and then openings in the substrate are filled with the desired via material. In accordance with an embodiment of the present disclosure, by depositing a sacrificial layer in a checkerboard pattern, the vias can be precisely located within the integrated circuit structure, as will be appreciated in light of the present disclosure.

Figure 1B:
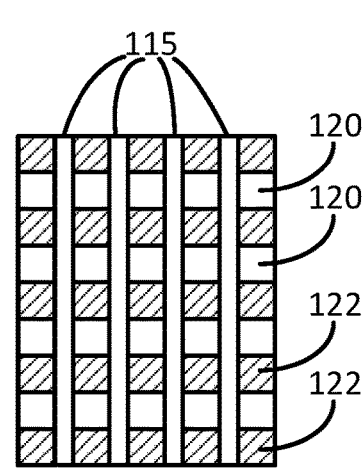
Figure 1C:
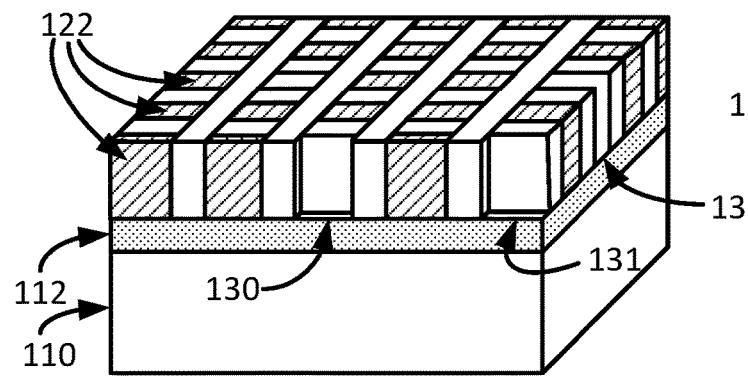
Figure 1D:
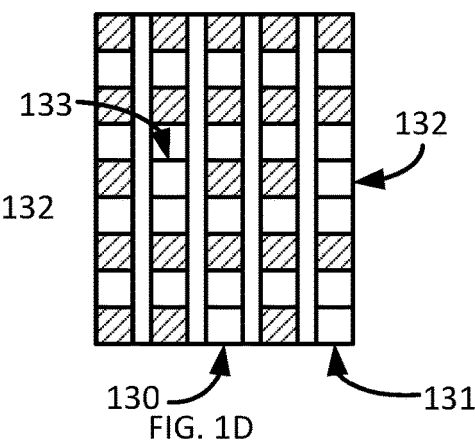
Figure 1E:
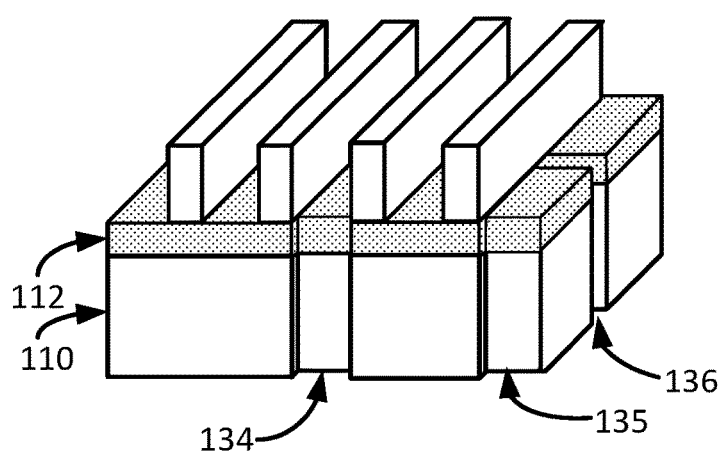
Figure 1F:
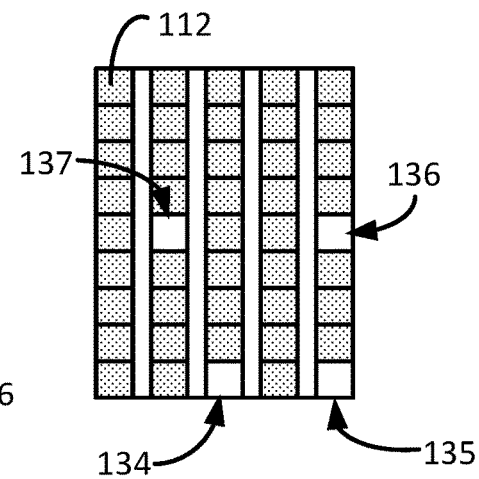
Figure 1G:
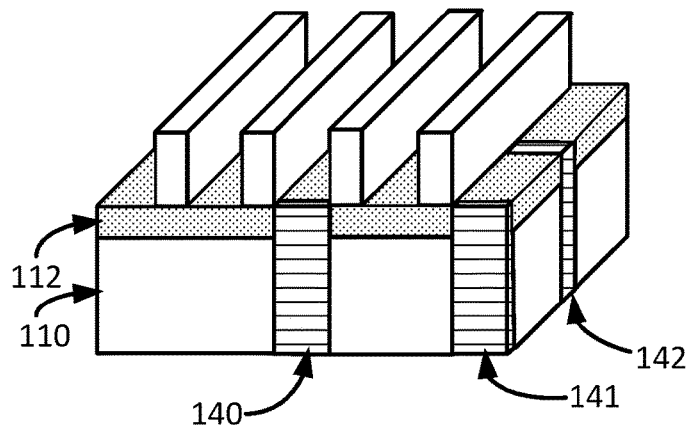
Figure 1H:
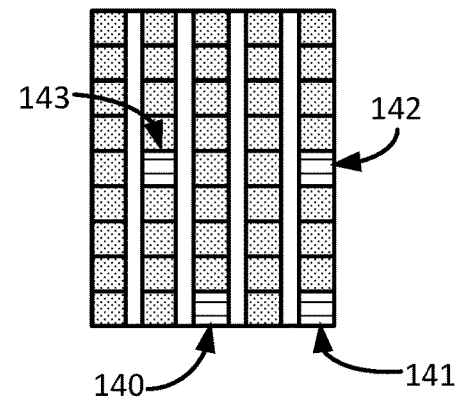
Figure 1I:
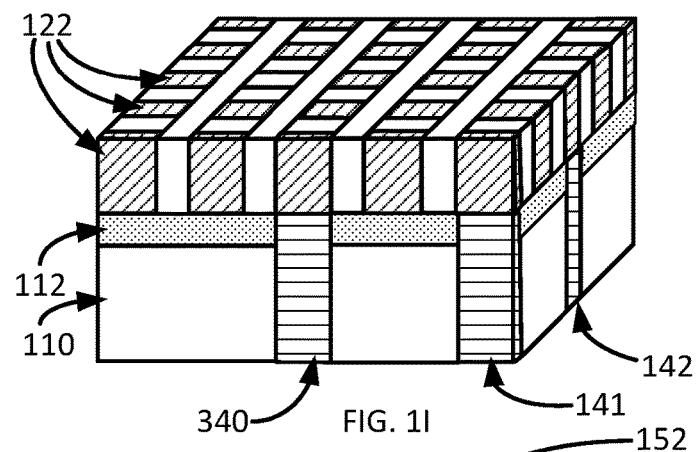
Figure 1J:
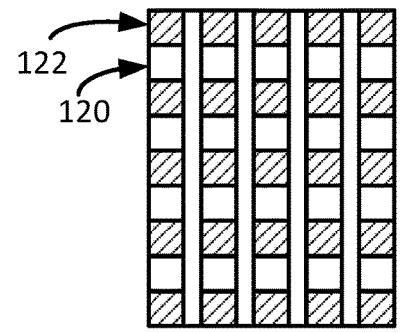
Figure 1K:
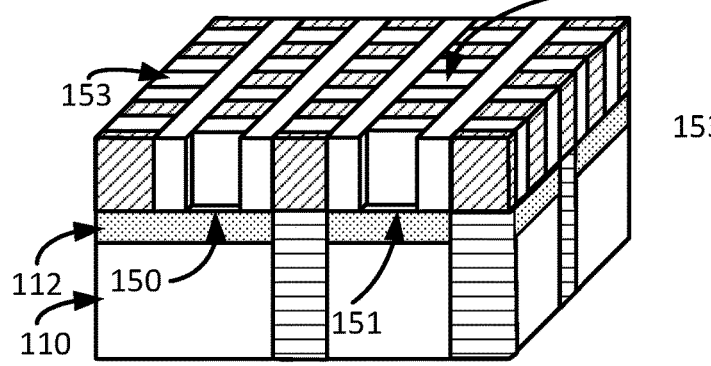
Figure 1L:
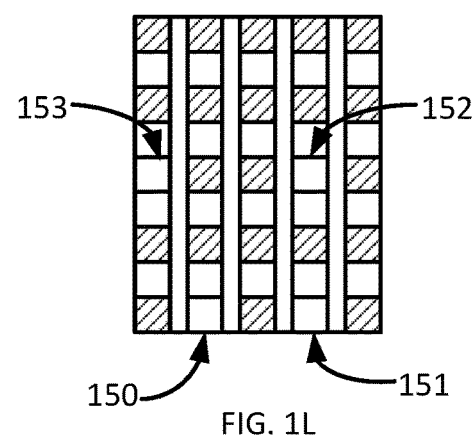
Figure 1M:
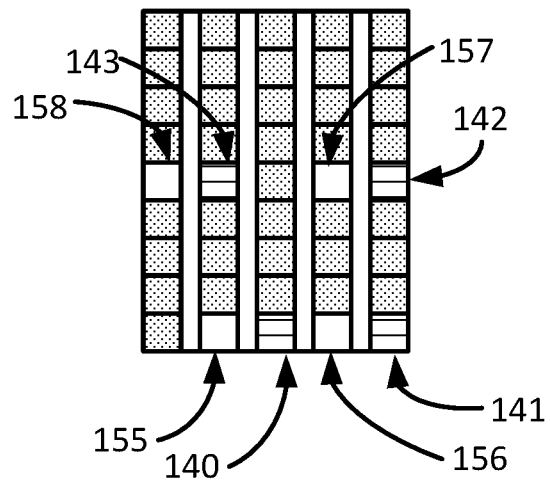
Figure 1N:
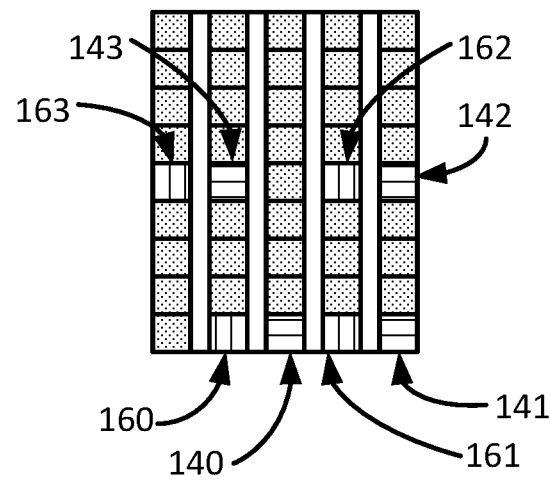
Figure 1O:
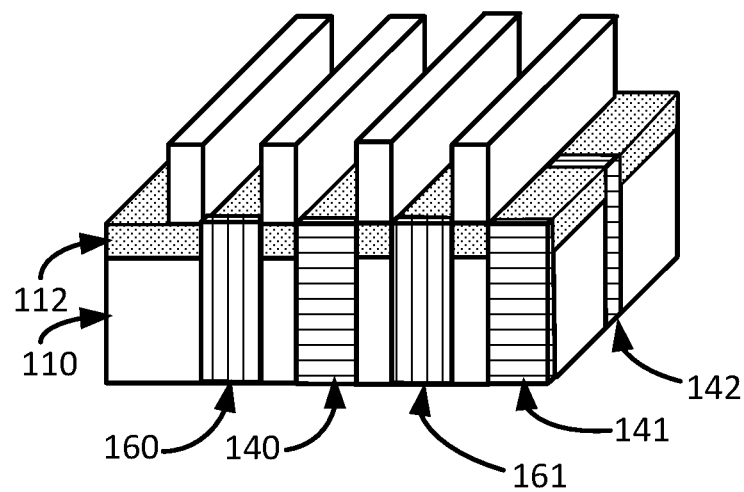

FIGS. 1A-1O illustrate various example perspective and cross-sectional views of integrated circuit structures having vias formed by an additive via forming process, in accordance with an embodiment of the present disclosure. It will be appreciated in light of the present disclosure that these illustrate only one example method of implementing the steps to arrive at the structure of FIG. 1O, and other modification and variations, as well as further processing, will be apparent. Although a substrate is not shown in FIGS. 1A-1O, it will be appreciated in light of the present disclosure that the layers can be formed on or above a substrate, either directly or with other intervening layers. For example, the structure shown in FIGS. 1A-1O can be part of a larger integrated circuit structure, such as the structure shown in FIGS. 6-9, as will be appreciated in light of the present disclosure.

FIG. 1A illustrates an example perspective view of an integrated circuit structure that is formed after a dielectric material, an etch stop layer, a plurality of spacers, and a first checkerboard material are deposited in accordance with an embodiment of the present disclosure. The integrated circuit structure can be deposited, for example, on or above a substrate, or other layer of an integrated circuit structure. In accordance with an embodiment of the present disclosure, a dielectric material 110 is deposited on a surface, such as a substrate, a magnet, or other layer of an integrated circuit structure. An etch stop layer 112 is formed on the dielectric layer and a plurality of spacers 115 are formed on the etch stop layer. As shown in FIG. 1A, a first sacrificial material 120 of a sacrificial layer is patterned or otherwise formed on the etch stop layer 112. FIG. 1B illustrates a top view of the integrated circuit structure after a second sacrificial material 122 of the sacrificial layer is deposited on the etch stop layer 112. The first sacrificial material 120 and second sacrificial material 122 of the sacrificial layer are deposited in a checkerboard pattern on the etch stop layer 112.

It will be appreciated that the dielectric layer 110 can be any appropriate dielectric or insulating material, such as silicon oxide, silicon dioxide, silicon nitride, silicon oxide carbide, various low-k dielectric materials, etc., and the etch stop layer 112 can be any appropriate etch stop layer having a density that is greater than a density of the dielectric layer 110. The spacers 115 can be comprised of any hard material, such as a dioxide or dinitride silicon oxide, as will be appreciated. The materials for the sacrificial layer, including first material 120 and second material 122, can be any materials selected such that the materials each have different levels of resistance with respect to a given etch chemistry. The materials for the sacrificial layer can be organic materials, having a different etch resistance with respect to each other. For example, the first material 120 can have a first resistance and the second material 122 can have a second resistance that is greater than the first resistance of the first material 120, as will be appreciated. Thus, regions of the sacrificial layer having a first resistance can be removed (for example, by etching, lithography, or a combination of both) with little or no impact on surrounding regions of a second resistance that is greater than the first resistance. Example etchants include hydrochloric acid, hydrofluoric acid, and nitric acid, although any number of selective etch schemes will be appreciated in light of this disclosure.

The dielectric layer 110, etch stop layer 112, and the spacers 115 can be deposited by any appropriate deposition technique, such as chemical vapor deposition (CVD) or molecular beam epitaxy (MBE). The checkerboard pattern of the sacrificial layer can be deposited according to any appropriate deposition technique, such as a chemical vapor deposition (CVD) or molecular beam epitaxy (MBE), by applying the spacers, then applying a first sacrificial layer, and then a second layer to fill in the checkerboard pattern.

FIG. 1C illustrates a perspective view of an integrated circuit structure that is formed after certain regions of the sacrificial layer have been removed, in accordance with an embodiment of the present disclosure. The regions of the sacrificial layer (and, more specifically, of the material 122) are removed where it is desired to have vias present in the layer of the dielectric material 110. FIG. 1D illustrates a top view of the integrated circuit structure of FIG. 1C. As shown, the regions 130, 131, 132, and 133 have been removed from the sacrificial layer, which correspond to the regions where it is desired to have vias in the underlying layer where the dielectric material is present.

It will be appreciated that the one or more regions of the checkerboard pattern can be removed according to any appropriate technique, including but not limited to lithography, etching, or any combination thereof. It will be appreciated that lithography can include extreme ultraviolet (EUV) lithography and other lithographic procedures. The sacrificial layer includes a checkerboard pattern of a first material having a first resistance and a second material having a second resistance. It will be appreciated that an etchant or lithographic process can be selected to selectively remove one or more regions of the sacrificial layer without impacting the surrounding regions of the sacrificial layer.

FIG. 1E illustrates a perspective view of an integrated circuit structure that is formed after the dielectric material has been etched away through the removed regions in the checkerboard pattern to reveal openings in the dielectric material, in accordance with an embodiment of the present disclosure. FIG. 1F illustrates a top view of the integrated circuit structure of FIG. 1E. As shown, the openings 134, 135, 136, and 137 are formed in the dielectric material 110. The openings in the dielectric material can be formed according to any appropriate etching technique, as will be appreciated.

FIG. 1G illustrates a perspective view of an integrated circuit structure that is formed after a first via material has been filled in the openings of the dielectric material, in accordance with an embodiment of the present disclosure. FIG. 1H illustrates a top view of the integrated circuit structure of FIG. 1G. As shown, the opening 134 has been filled in with first via material to form the first via 140, the opening 135 has been filled in with the first via material to form the second via 141, the opening 136 has been filled in with the first via material to form the third via 142, and the opening 137 has been filled in with the first via material to form a fourth via 143. Note that the openings are not shown in FIG. 1G, but are visible in FIGS. 1E and 1F.

In an example embodiment, the first via material can comprise a spin orbit coupling material, and can include a non-magnetic metal material, such as silver (Ag), aluminum (Al), gold (Au), or copper (Cu) connected to a spin orbit coupling material that is a material or materials that will exhibit a spin orbit effect in a metallic system. Representative materials for spin orbit coupling material include an element of group V of the Periodic Table of Elements and their alloys (e.g., bismuth, bismuth-silver alloys) or traditional interconnect materials (e.g., copper (Cu)), gold (Au), and aluminum (Al)), doped with high atomic weight transition elements that will produce a strong or high spin orbit coupling at the interface of the metal material and the spin orbit coupling material on the order of 0.01 nm to 100 nm, according to some example embodiments.

According to the additive via formation process, the via material can be deposited in the openings in the layer of dielectric material by any appropriate deposition technique, such as metalorganic chemical vapor deposition (MOCVD), atomic layer deposition (ALD), physical vapor deposition (PVD).

FIG. 1I illustrates a perspective view of an integrated circuit structure resulting after a sacrificial layer has been deposited in a checkerboard pattern on the etch stop layer, in accordance with an embodiment of the present disclosure. FIG. 1J illustrates a top view of the integrated circuit structure of FIG. 1I. As shown in FIGS. 1I and 1J, the sacrificial layer includes a first material 120 and a second material 122 deposited in a checkerboard pattern on the etch stop layer 112. The checkerboard pattern can be deposited according to any appropriate deposition technique, such as chemical vapor deposition (CVD) or molecular beam epitaxy (MBE).

It will be appreciated in light of the present disclosure that the first material 120 and the second material 122 for the sacrificial layer deposited for the second via material (as shown, for example, in FIGS. 1I and 1J) can be the same materials as the sacrificial layer for the first via material (as shown, for example in FIGS. 1A and 1B), or the materials for the sacrificial layer can be different materials. The materials 120 and 122 can have differing levels of resistance for the subsequent removal of one or more regions of the sacrificial layer, as will be appreciated in light of the present disclosure.

FIG. 1K illustrates a perspective view of an integrated circuit structure resulting after one or more regions of the checkerboard pattern have been removed, in accordance with an embodiment of the present disclosure. FIG. 1L illustrates a top view of the integrated circuit structure of FIG. 1K. As shown in FIGS. 1K and 1L, the regions 150, 151, 152, and 153 have been removed in the sacrificial layer. The regions can be removed according to any appropriate technique, including but not limited to lithography, etching, or any combination of both lithography and etching, as will be appreciated.

FIG. 1M illustrates a top view of an integrated circuit structure resulting after the dielectric material has been etched away through the removed regions in the checkerboard pattern to reveal openings in the dielectric material, in accordance with an embodiment of the present disclosure. As shown, the openings 55, 156, 157, and 158 have been formed in the layer of the dielectric material. The openings can be formed by any appropriate etching technique, as will be appreciated. The vias 140, 141, 142, and 143 formed of the first via material are also shown in FIG. 1M.

FIG. 1N illustrates a top view of an integrated circuit structure resulting after a second via material has been filled in the openings (155, 156, 157, and 158 in FIG. 1M) in the dielectric material, in accordance with an embodiment of the present disclosure. FIG. 1O illustrates a perspective view of the integrated circuit structure of FIG. 1N. The vias 160, 161, 162, and 163 formed of the second via material are shown formed on a same layer as the vias 140, 141, 142, and 143 formed of the first via material. It will be appreciated in light of the present disclosure that depositing the sacrificial layer as a checkerboard pattern, and then subsequently removing certain regions of the checkerboard pattern, allows the vias to be precisely located with the correct dimensions and proper alignment within the overall integrated circuit structure.

In accordance with an example embodiment, the second via material can comprise a functional oxide or magneto electric dielectric material, such as, but not limited to, bismuth ferrite (BFO), chromium (III) oxide ($Cr_2O_3$) or magnesium oxide (MgO). The functional oxide material can be a single material that directly produces a magneto-electric effect. In another embodiment, the functional oxide material can be a combination of materials such as multiple layers of oxides and intermetallics that define a dielectric stack.

According to the additive via formation process, the via material can be deposited according to any deposition technique, for example metalorganic chemical vapor deposition (MOCVD), atomic layer deposition (ALD), and physical vapor deposition (PVD).

Although the vias 163, 143, and 162 are not visible in FIG. 1O, their location is shown in the top view of FIG. 3N. It will be appreciated in light of the present disclosure that the checkerboard pattern allows the vias to be located at the precise desired location, without (or with minimal) drift between the alignment of the vias.

The resulting structure provides first vias of a first via material and second vias of a second via material in the dielectric layer at the precise target location as desired, and having the accurate critical dimensions for the via. The sacrificial layer deposited in a checkerboard pattern allows the vias to be precisely placed in the underlying layer of dielectric material, and ensures the vias have accurate critical dimensions. Providing vias of two different materials on a same layer at the correct dimensions and location may facilitate operation of certain devices, such as a magnetoelectric spin orbital (MESO) device.

It will be appreciated that additional processing can be performed on the structure of FIG. 1O. For example, the spacers can be removed, and additional layers can be deposited on the via layer. Another layer of an integrated circuit structure can be deposited on the structure once the spacers are removed. It will also be appreciated that the structure shown in FIG. 1O can be part of an overall integrated circuit structure, having multiple layers underlying the via contact layer and/or upon which the vias contact layer can be deposited.

Figure 2:
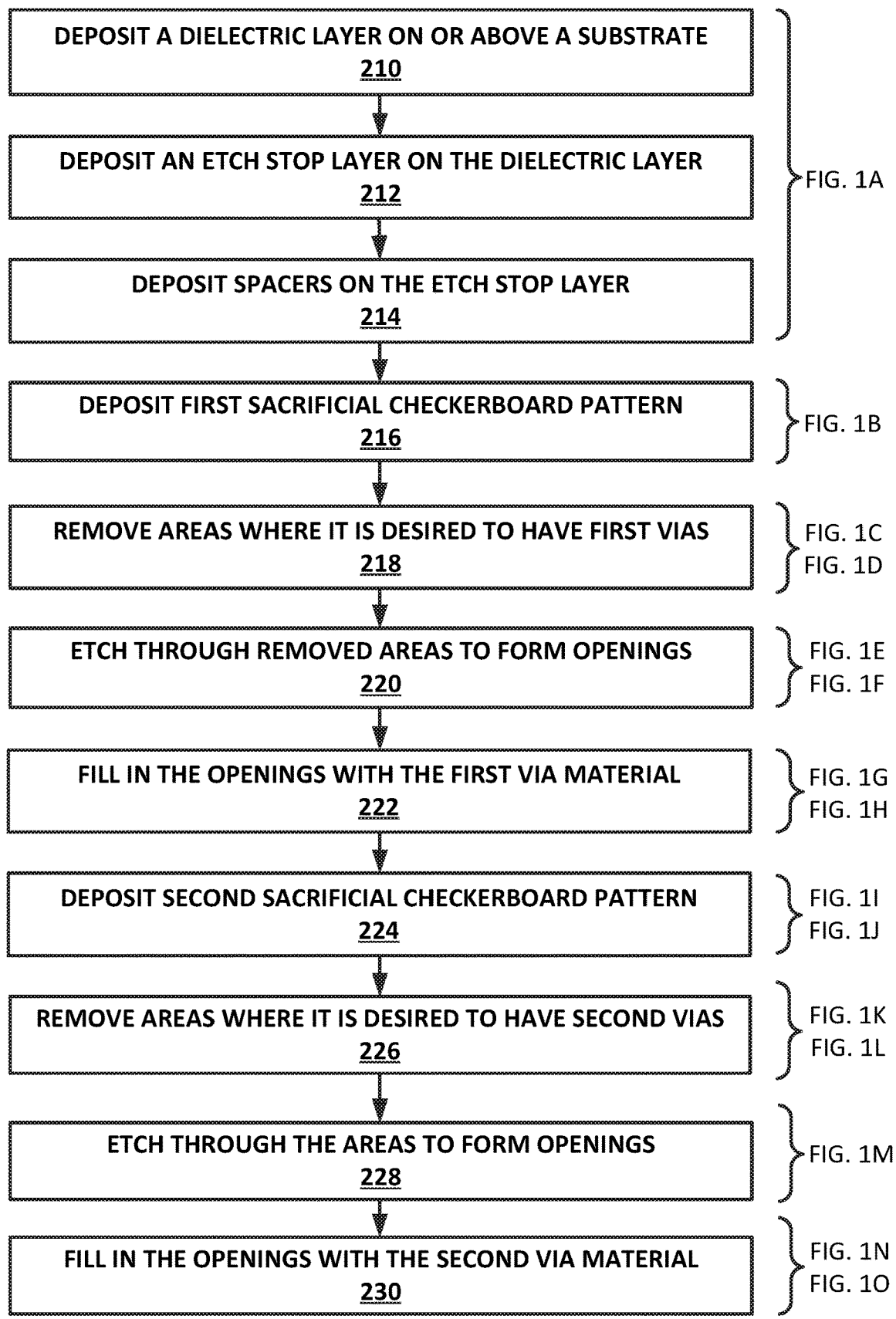
FIG. 2 illustrates a methodology for forming vias in an additive via forming process according to FIGS. 1A-1O, in accordance with an embodiment of the present disclosure.

FIG. 2 illustrates a methodology for forming vias in an additive via forming process according to FIGS. 1A-1O, in accordance with an embodiment of the present disclosure. It will be appreciated in light of the present disclosure that this is only one example methodology to arrive at the structure of FIG. 1O.

At 210, a layer of dielectric material is deposited on or above a substrate. The layer of dielectric material can be comprised of any appropriate insulating material, as will be appreciated. At 212, an etch stop layer is deposited on the layer of dielectric material. At 214, spacers are deposited or otherwise formed (e.g., lithography-based patterning/masking and etching) on the etch stop layer. The dielectric material, the etch stop layer(s) and the spacers can be deposited according to any appropriate deposition technique, for example, by chemical vapor deposition (CVD) or molecular beam epitaxy (MBE). Refer, for example to FIG. 1A illustrating an integrated circuit structure having a layer of dielectric material with an etch stop layer deposited on the layer of the dielectric material, and spacers deposited on the etch stop layer.

At 216, a first sacrificial layer is deposited or otherwise formed on the etch stop layer in a checkerboard pattern. The first sacrificial layer includes a first sacrificial material and a second sacrificial material deposited in a checkerboard pattern, in accordance with an embodiment of the present disclosure. Refer, for example, to FIG. 1B illustrating an integrated circuit structure having the first sacrificial layer deposited thereon. The sacrificial layer can be formed according to any appropriate technique, as will be appreciated.

At 218, one or more areas in the first sacrificial layer are removed where it is desired to have vias in the underlying dielectric layer. The areas can be removed according to any appropriate technique, including but not limited to lithography, etching, or a combination of both lithography and etching. Refer, for example, to FIGS. 1C and 1D showing, respectively, perspective and top views of the integrated circuit structure after one or more areas have been removed in the first sacrificial layer. Note that, as shown in FIGS. 1C and 1D, four areas have been removed in the sacrificial layer, however the number of areas to be removed is highly variable depending upon the number of vias desired in the end material.

At 220, openings are formed in the underlying dielectric material by etching through the removed areas in the first sacrificial layer. This can be performed by any appropriate etching technique, as will be appreciated. Refer, for example, to FIGS. 1E and 1F illustrating, respectively, a perspective view and a top view of the integrated circuit structure after the openings have been formed in the layer of the dielectric material after etching through the removed regions in the sacrificial layer.

At 222, the openings in the layer of the dielectric material can be filled in with a first via material. The openings can be filled according to any appropriate deposition technique, such as metalorganic chemical vapor deposition (MOCVD), atomic layer deposition (ALD), or physical vapor deposition (PVD), as will be appreciated. Refer, for example, to FIGS. 1G and 1H illustrating, respectively, a perspective view and a top view of an integrated circuit structure after the openings have been filled with a first via material.

It will be appreciated in light of the present disclosure that the foregoing processing results in vias formed of a first via material, and can thus be repeated for a second via material to provide vias formed of a second via material on a same layer as the vias formed of the first via material. It will also be appreciated in light of the present disclosure that by providing the checkerboard pattern, the vias can be precisely located at the desired location, and in the desired exact dimensions, even as the size and scaling becomes very small (for example, less than 7 nm).

At 224, a second sacrificial layer is deposited in a checkerboard pattern on the layer of dielectric material. It will be appreciated in light of the present disclosure that the layer of dielectric material has the vias of the first via material deposited therein. The second sacrificial layer can be deposited according to any appropriate deposition technique, as will be appreciated. Refer, for example, to FIGS. 1I and 1J showing, respectively, a perspective view and a top view of an integrated circuit structure with a second sacrificial layer deposited on the dielectric layer.

At 226, areas of the second sacrificial layer are removed where it is desired to have second vias in the underlying dielectric material. This can be performed, for example, by lithography, etching, or a combination of etching and lithography. Other techniques for selectively etching one material (e.g., the first material of the checkerboard pattern) with respect to another material (e.g., the second material of the checkerboard pattern) can be implemented, as will be appreciated. Refer, for example, to FIGS. 1K and 1L showing, respectively, a perspective view and a top view of an integrated circuit structure after regions of the second sacrificial layer have been removed. In this example, four regions have been removed.

At 228, openings are formed in the underlying layer of dielectric material by etching through the areas in the second sacrificial layer that were removed. The openings can be etched by any appropriate etching technique, as will be appreciated. Refer, for example, to FIG. 1M showing a top view of an integrated circuit structure after the openings have been formed in the dielectric layer of dielectric material.

At 230, the openings in the dielectric layer are filled with a second via material, in accordance with an embodiment of the present disclosure. The openings can be filled by any appropriate deposition technique, such as metalorganic chemical vapor deposition (MOCVD), atomic layer deposition (ALD), and physical vapor deposition (PVD). Refer, for example, to FIGS. 1N and 1O showing, respectively, a top view and a perspective view of an integrated circuit structure after the openings in the dielectric material have been filled with the second via material. Note that the resulting structure provides one via contact layer having vias of two different materials formed therein. Further, the vias are precisely located and dimensioned by using the checkerboard pattern and the spacers. The spacers can be removed or otherwise further processed, as will be appreciated.

Methodology and Architecture—Subtractive Via Formation Process

In accordance with an embodiment of the present disclosure, a subtractive via formation process is implemented to form vias for an integrated structure. In a subtractive via formation process, the desired via material is deposited as a blanket material and then the undesired portions are etched away according to one or more embodiments of the present disclosure. FIGS. 3A-3J illustrate example perspective and cross-sectional views of integrated circuit structures having vias formed by a subtractive via forming process, in accordance with an embodiment of the present disclosure.

Figure 3A:
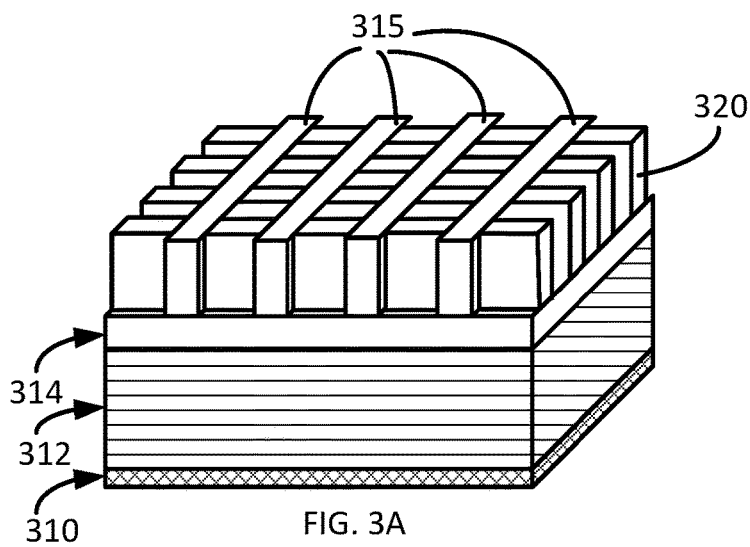
FIGS. 3A-3J illustrate example perspective and cross-sectional views of integrated circuit structures having vias formed by a subtractive via forming process, in accordance with an embodiment of the present disclosure.
Figure 3B:
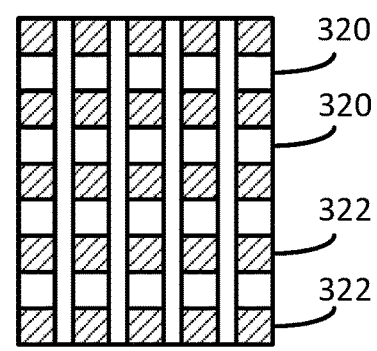

FIG. 3A illustrates a perspective view of an integrated circuit structure resulting after a first layer of a first via material is deposited on a first etch stop layer, a second etch stop layer is deposited on the first layer of the first via material, spacers are deposited on the second etch stop layer, and a first sacrificial material is deposited on the second etch stop layer. A base (or "bottom") etch stop layer 310 is deposited on or above a substrate (not shown). A first layer of a first via material 312 is deposited on the base etch stop layer 310. A second etch stop layer 314 is deposited on the layer of the first via material 312. As shown in FIG. 3A, a first sacrificial material 320 of a sacrificial layer is formed on the etch stop layer 314. FIG. 3B illustrates a top view of the integrated circuit structure after a second sacrificial material 322 of the sacrificial layer is deposited on the etch stop layer 314. The first sacrificial material 320 and the second sacrificial material 322 of the sacrificial layer are deposited in a checkerboard pattern on the etch stop layer 314.

The base etch stop layer 310, second etch stop layer 314, and the spacers 315 can be deposited by any appropriate deposition technique, for example chemical vapor deposition (CVD) or molecular beam epitaxy (MBE). The first via material 312 can be deposited according to any appropriate deposition technique, for example, (MOCVD), physical vapor deposition (PVD), chemical vapor deposition (CVD), pulsed laser deposition (PLD), or other metal deposition techniques.

It will be appreciated in light of the present disclosure that the first material 320 and the second material 322 of the sacrificial layer that is deposited in a checkerboard pattern can be the same as, respectively, the first material 120 and the second material 122 of the sacrificial layer as shown in FIG. 1A, in accordance with an embodiment of the present disclosure. The first material 320 and the second material 322 of the sacrificial layer can be different from the first material 120 and second material 122 shown in FIG. 1A. Likewise, the first material 320 and the second material 322 can be the same as the first material 120 and the second material 122 shown in FIG. 1I, or can be different materials.

Figure 3C:
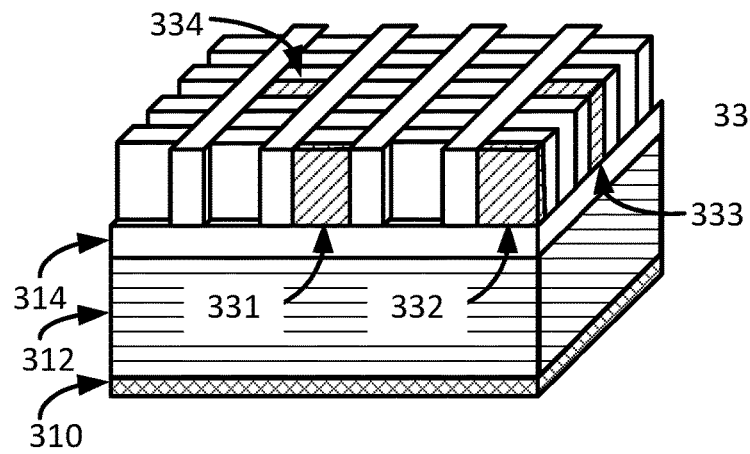
Figure 3D:
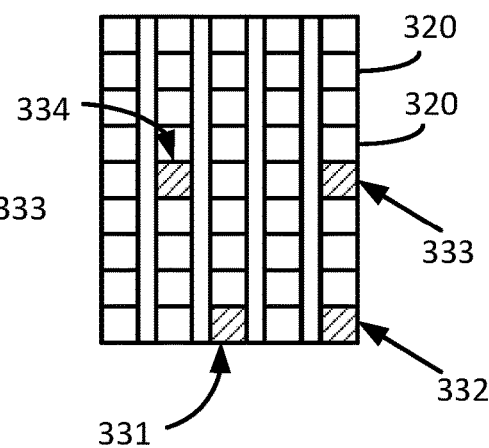

FIG. 3C illustrates a perspective view of an integrated circuit structure resulting after one or more regions of the checkerboard pattern have been removed. During the subtractive process, regions of the checkerboard pattern are removed where it is not desired to have vias in the underlying layer of via material. The regions of the checkerboard pattern can be removed according to any appropriate technique, including etching, lithography, or a combination of both etching and lithography. FIG. 3D illustrates a top view of the integrated circuit structure of FIG. 3C. As shown, all of the regions of the sacrificial material have been removed, except for regions 331, 332, 333, and 334. These regions will be protected from the subsequent processing to reveal vias in the underlying layer 312 of the via material.

Figure 3E:
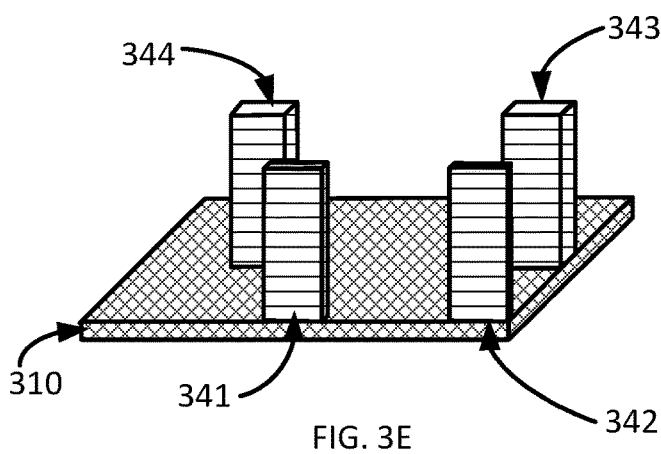

FIG. 3E illustrates a perspective view of an integrated circuit structure resulting after the removed regions of the checkerboard pattern have been etched through to reveal the vias of the first via material, in accordance with an embodiment of the present disclosure. As shown, after etching or otherwise processing the integrated circuit structure of FIG. 3D, the vias 341, 342, 343, and 344 are formed of the first via material, which was originally deposited as a blanket via layer 312 (as shown in FIGS. 3A and 3C). It will be appreciated in light of the present disclosure that the process can be repeated for a second via material to achieve vias of the second material formed on a same via contact layer as the vias of the first material.

Figure 3F:
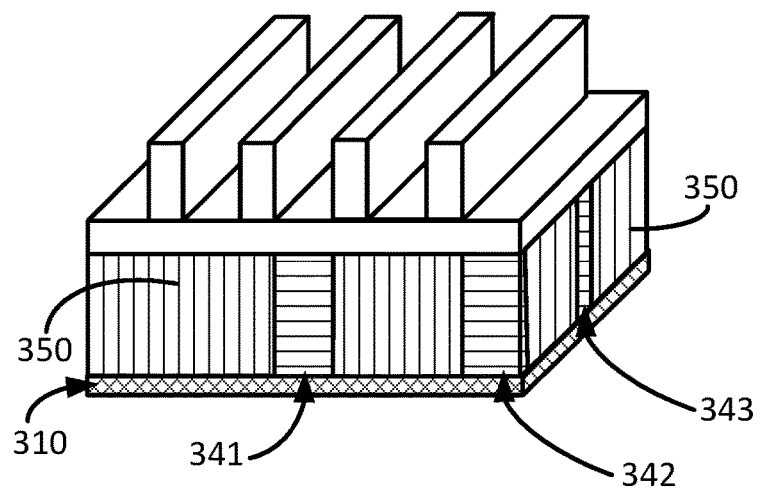
Figure 3G:
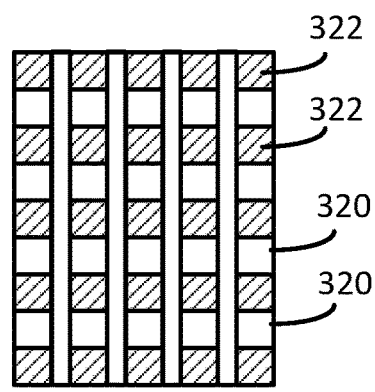

FIG. 3F illustrates a perspective view of an integrated circuit structure resulting after a layer of a second via material is deposited on the first etch stop layer, a second etch stop layer is deposited on the layer of the second via material, and spacers are deposited on the second etch stop layer. As shown, a layer of a second via material 350 has been deposited on the base etch stop layer 310. Note that this may involve planarizing the metal after it is deposited, prior to depositing the etch stop, to arrive at the structure shown in FIG. 3F. The etch stop layer 314 is deposited on the layer of the second via material 350, and the spacers are deposited on the etch stop layer 314. FIG. 3G illustrates a top view of the integrated circuit structure after a first sacrificial material 320 of the sacrificial layer is deposited on the second etch stop layer 314 and a second sacrificial material 322 of the sacrificial layer is deposited on the etch stop layer 314. The first sacrificial material 320 and second sacrificial material 322 of the sacrificial layer are deposited in a checkerboard pattern on the etch stop layer 314.

It will be appreciated in light of the present disclosure that the first sacrificial material 320 and the second sacrificial material 322 of the sacrificial layer shown in FIG. 3G can be the same as the first sacrificial material 320 and the second sacrificial material 322 of the sacrificial layer in FIG. 3B, or may be different materials. Likewise, the first sacrificial material 320 and the second sacrificial material 322 can be the same as the sacrificial materials 120 and 122 in FIGS. 1A and 1I, or can be different materials.

Figure 3H:
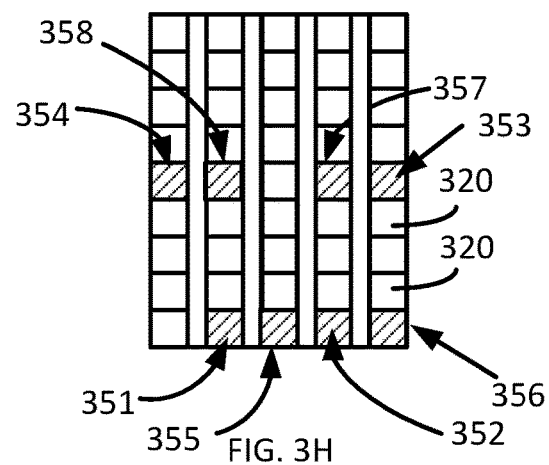

FIG. 3H illustrates a top view of an integrated circuit structure after one or more regions of the checkerboard pattern have been removed. According to the subtractive process, regions of the checkerboard pattern are removed where it is not desired to have vias in the underlying layer of via material. In this manner, these regions where it is not desired to have vias will not be protected during subsequent etching or lithography. Accordingly, the etching will remove via material in these areas where it is not desired to have vias, thereby forming vias of the via material where the vias are desired. As shown, regions of the sacrificial layer have been removed where it is not desired to have vias in the underlying layers, thus leaving regions 351, 352, 353, 354, 355, 356, 357, and 358. Specifically, in accordance with an embodiment of the present disclosure, regions 351, 352, 353, and 354, protect underlying regions of the via material to thereby form vias of the second via material in the underlying material, and regions 355, 356, 357, and 358 also remain to protect the underlying vias of the first via material. The remaining regions allow the underlying vias to be precisely protected from the processing to remove the undesired via material.

Figure 3I:
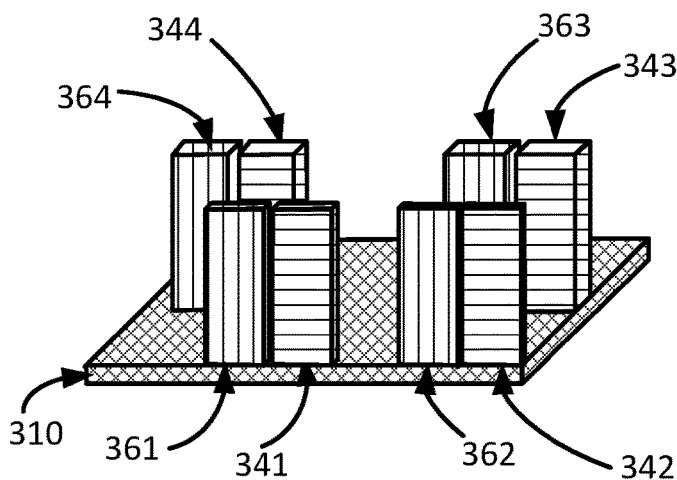
Figure 3J:
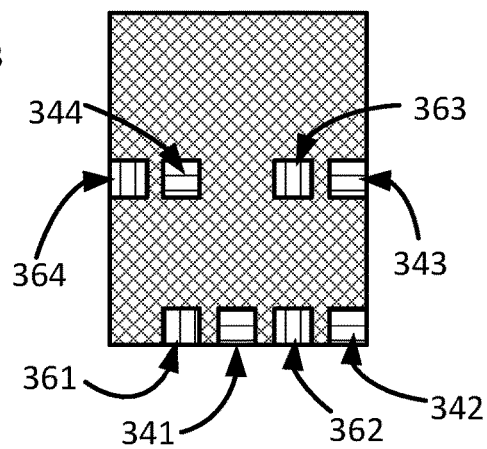

FIG. 3I illustrates a perspective view of an integrated circuit structure after the removed regions of the checkerboard pattern have been etched through to reveal the vias of the second via material. FIG. 3J illustrates a top view of the integrated circuit structure of FIG. 5I. As shown, there are four vias 341, 342, 343, and 344 formed of the first via material, and four vias 361, 362, 363, and 364 formed of the second via material. The number of vias is highly variable depending upon the desired final integrated circuit structure. The resulting via contact layer provides vias of the first via material and vias of the second material at precise locations within the integrated circuit structure.

Figure 4:
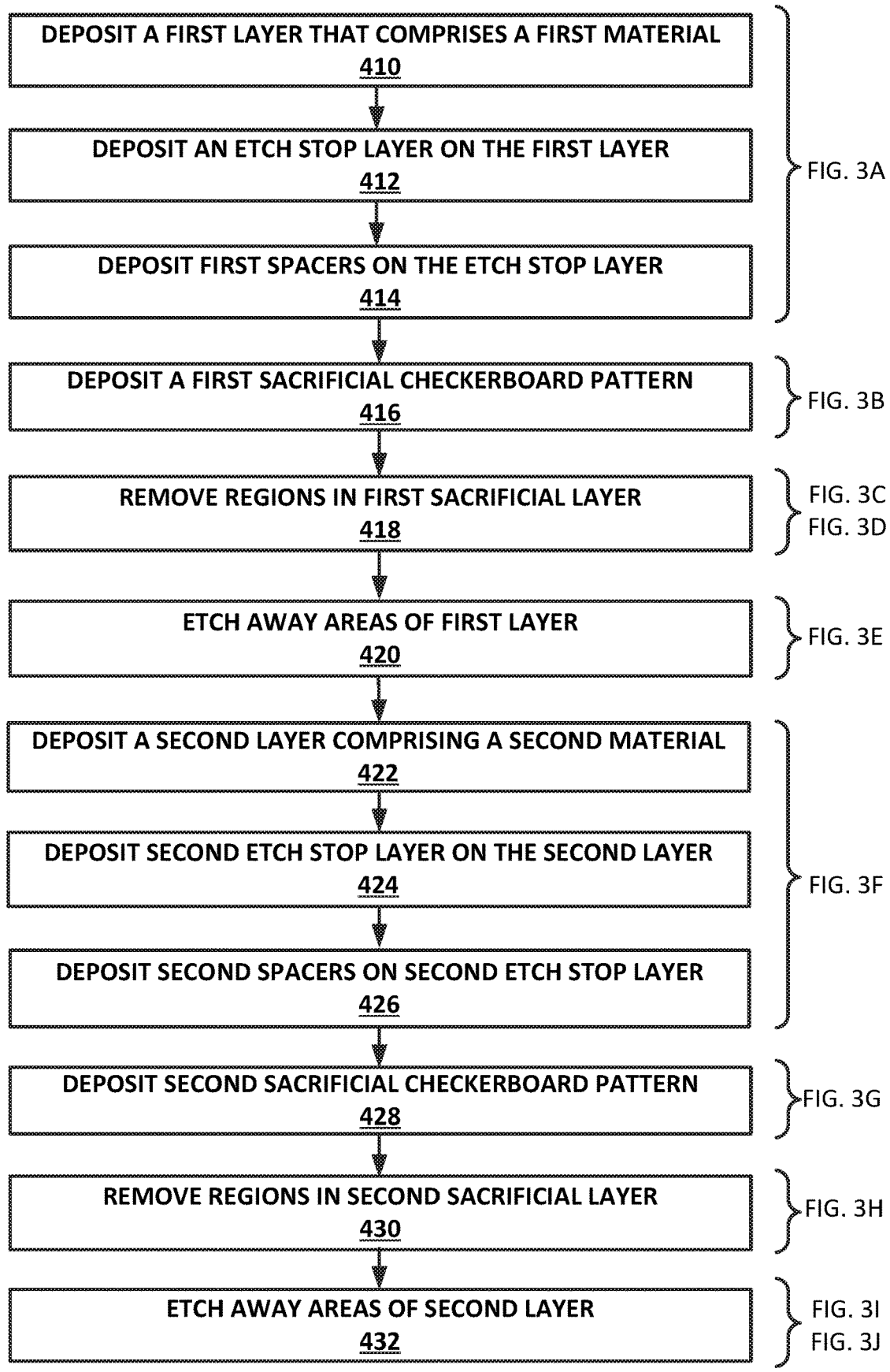
FIG. 4 illustrates a methodology for forming vias in a subtractive via forming process according to FIG. 3A-3J, in accordance with an embodiment of the present disclosure.

FIG. 4 illustrates a methodology for forming vias in a subtractive via forming process according to FIG. 3A-3J, in accordance with an embodiment of the present disclosure. It will be appreciated in light of the present disclosure that the methodology is only one example to arrive at the structure of FIG. 3J.

At 410, a first layer is deposited that comprises a first via material. This can be deposited on a base etch stop layer, which is deposited on or above a substrate. The first layer can be deposited by any appropriate deposition technique, such as metalorganic chemical vapor deposition (MOCVD), physical vapor deposition (PVD), chemical vapor deposition (CVD), pulsed laser deposition (PLD), or other metal deposition techniques. At 412, an etch stop layer is deposited on the first layer of the first via material. At 414, first spacers are deposited or otherwise formed on the etch stop layer. The etch stop layer(s) and the spacers can be deposited by any appropriate deposition technique, as will be appreciated. Refer, for example, to FIG. 3A showing an integrated circuit structure resulting after the first layer has been deposited on a base etch stop layer, a second etch stop layer has been deposited on the first layer, and spacers have been deposited on the second etch stop layer.

At 416, a first sacrificial layer is deposited or otherwise formed on the second etch stop layer in a checkerboard pattern. The sacrificial layer can be deposited by any appropriate deposition technique, such as chemical vapor deposition (CVD) or molecular beam epitaxy (MBE). Refer, for example, to FIG. 3B showing a top view of an integrated circuit structure after the first sacrificial layer has been deposited in a checkerboard pattern on the second etch stop layer. As shown in FIG. 3A, the first material of the sacrificial layer has been deposited, and in FIG. 3B the second material of the sacrificial layer has been deposited to form the checkerboard pattern.

At 418, one or more regions of the first sacrificial layer are removed, in accordance with an embodiment of the present disclosure. According to the subtractive patterning technique, regions of the sacrificial layer are removed where it is not desired to have vias in the underlying layer of first via material. The regions can be removed according to any appropriate technique, including but not limited to lithography, etching, or a combination of both lithography and etching. Refer, for example, to FIGS. 3C and 3D showing, respectively, a perspective view and a top view of an integrated circuit structure after one or more regions of the first sacrificial layer have been removed.

At 420, areas of the first layer of the first via material are etched away through the removed regions in the sacrificial layer. The etching can be performed by any appropriate etching technique, as will be appreciated. Refer, for example, to FIG. 3E showing an integrated circuit structure after the areas of the first layer have been etched away through the removed regions in the sacrificial layer. Note that areas of the first vias also remain in this structure, as shown in FIG. 3E.

At 422, a second layer comprising a second via material is deposited on a base etch stop layer. The second layer can be deposited by metalorganic chemical vapor deposition (MOCVD), physical vapor deposition (PVD), chemical vapor deposition (CVD), pulsed laser deposition (PLD) or other metal deposition technique. At 424, a second etch stop layer is deposited on the second layer of second via material. At 426, second spacers are deposited on the second etch stop layer. The etch stop layer and the spacers can be deposited by any appropriate deposition technique, as will be appreciated. Refer, for example, to FIG. 3F showing an integrated circuit structure having a second layer deposited on a base etch stop layer, with a second etch stop layer deposited on the second layer, and spacers deposited on the second etch stop layer.

At 428, a second sacrificial layer is deposited on the second etch stop layer in a checkerboard pattern. The second sacrificial layer includes a first material and a second material, and can be deposited in a checkerboard pattern by any appropriate deposition technique, such as chemical vapor deposition (CVD) or molecular beam epitaxy (MBE). Refer, for example, to FIG. 3G illustrating a top view of an integrated circuit structure after a second sacrificial layer has been deposited on the second etch stop layer.

At 430, one or more regions of the second sacrificial layer are removed. The regions can be removed by any appropriate technique, including but not limited to lithography, etching, or a combination or both lithography and etching. As will be appreciated in light of the present disclosure, the regions of the sacrificial layer are removed where it is desired to not have vias in the underlying layer of the second via material. Refer, for example, to FIG. 3H illustrating a top view of an integrated circuit structure after regions have been removed in the second sacrificial layer.

At 432, areas of the second layer of the second via material are etched away through the removed regions of the second sacrificial layer. It will be appreciated that the etching can be any appropriate etching or lithography or a combination of both lithography and etching. Refer, for example, to FIGS. 3I and 3J illustrating, respectively, a perspective view and a top view of an integrated circuit structure after areas of the second layer have been etched away through the removed regions of the second sacrificial layer, revealing vias formed of the second via material.

As shown, the resulting structure provides one or more vias of a first via material and one or more vias of a second via material different from the first via material on or above a substrate. The vias are precisely located at the desired positions in the integrated circuit structure by use of the sacrificial layer deposited in a checkerboard pattern.

Further processing can be performed, such as depositing a dielectric layer around the vias, or other processing. It will be appreciated that the via contact layer can be formed on a substrate or on one or more layers of materials over a substrate. Further, additional layers and interconnections can be formed on or over the via contact layer.

Architecture—Additive Process and Subtractive Process

Figure 5A:
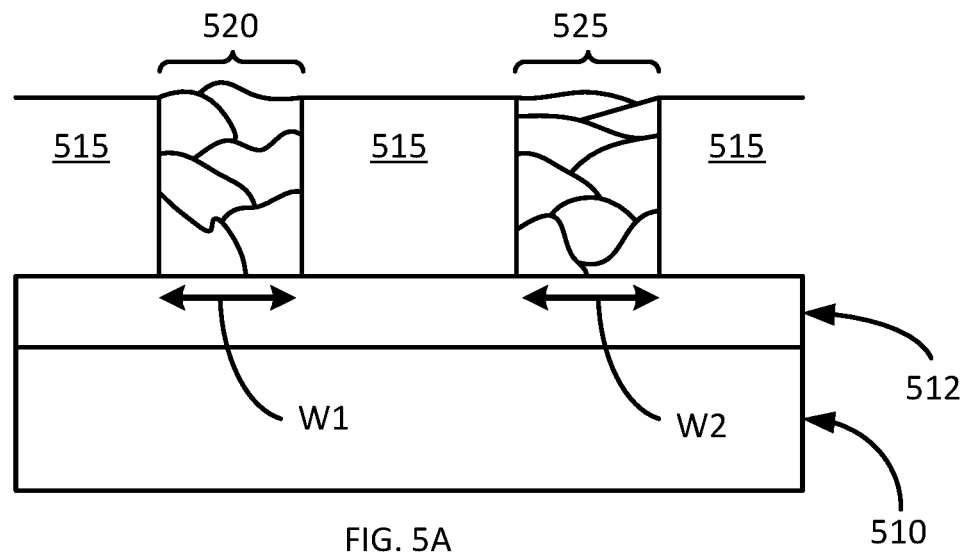
FIGS. 5A and 5B illustrate example cross-sectional views of an integrated circuit structure having vias formed in accordance with an additive via forming embodiment of the present disclosure.
Figure 5B:
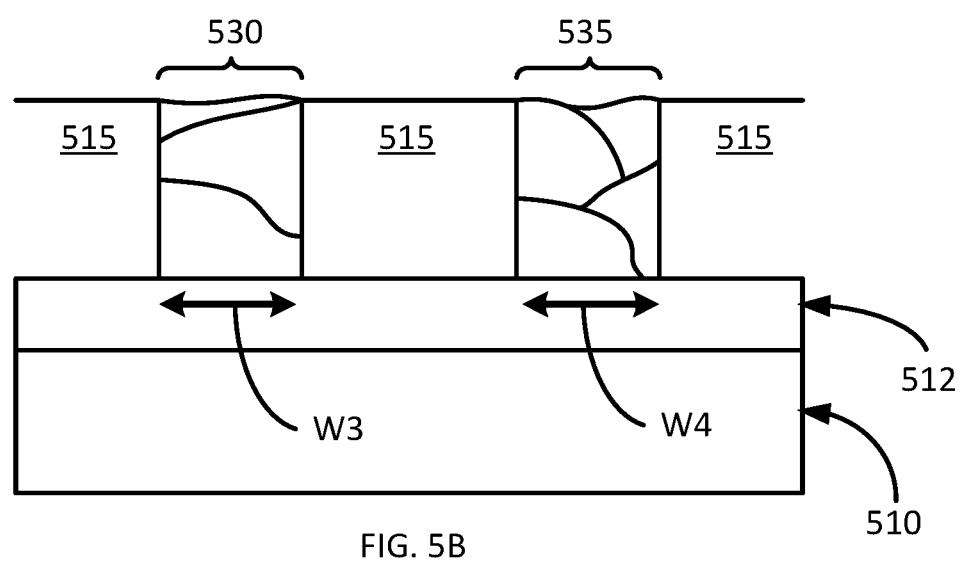
Figure 5C:
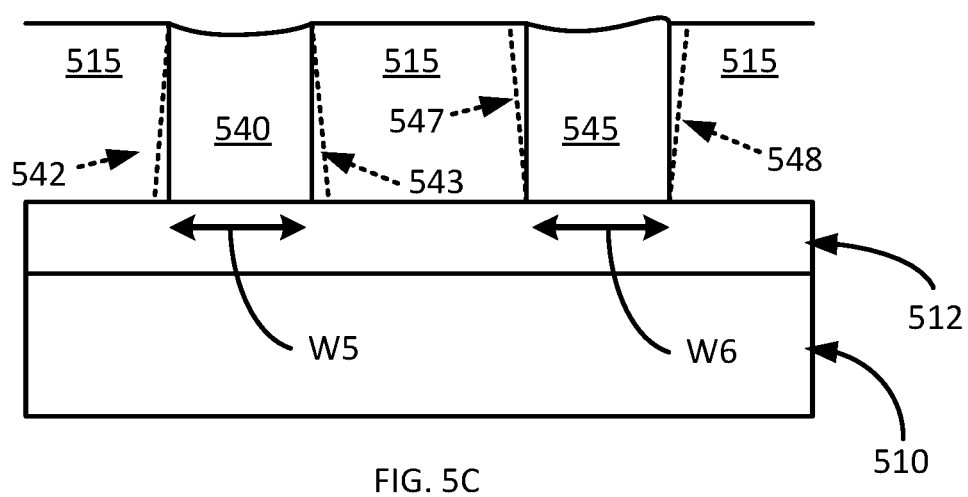
FIG. 5C illustrates an example cross-sectional view of an integrated circuit structure having vias formed in accordance with a subtractive via forming embodiment of the present disclosure.

FIGS. 5A, 5B, and 5C illustrate example cross sectional views of an integrated circuit structure formed in accordance with an embodiment of the present disclosure. FIGS. 5A and 5B illustrate example cross-sectional views of an integrated circuit in accordance with an additive via forming process of the present disclosure, and FIG. 5C illustrates an example cross-sectional view of an integrated circuit in accordance with a subtractive via forming process of the present disclosure. These cross-sectional views are taken through the substrate and through the vias and perpendicular to the vias.

The cross-sectional view is taken after the vias have been formed and a dielectric material has been deposited around the vias.

FIG. 5A illustrates a cross-sectional view of an example integrated circuit structure formed in accordance with an additive via forming process of the present disclosure. As shown, a substrate 510 has an etch stop layer 512 formed on or above the substrate. The vias 520, 525 are formed on the etch stop layer, and are surrounded by a dielectric material 515, such as a shallow trench isolation (STI) material. It will be appreciated that other materials and layers can be formed between the substrate 510 and the vias 520, 525. Note that, because the first via material of the first via 520 and the second via material of the second via 525 are formed by an additive process, the grain boundaries are clearly visible in the cross-section view. As shown, the grain boundaries are less than the width of the via. Respectively, the grain boundaries of the via 520 have a width that is less than the width W1, and the grain boundaries of the via 525 have a width that is less than the width W2. The width (and/or visibility) of the grain boundaries can be determined, for example, using a transmission electron microscopy of an integrated circuit. The resulting vias can have a crystalline structure that is not uniform, as shown in the vias 520, 525. Further note that the grain boundaries are visible.

FIG. 5B illustrates a cross-sectional view of an example integrated circuit structure formed in accordance with an additive via forming process of the present disclosure. Note that the grain boundaries of vias 530, 535 are larger than the vias 520, 525 of FIG. 7A, however are still clearly visible in the cross-section view. As shown, the grain boundaries of the via 530 have a width that is less than the width W3 of the via 530, and likewise the grain boundaries of the via 535 have a width that is less than the width W4 of the via 535. The resulting vias can disadvantageously be formed of a non-uniform material, where the grain boundaries are visible.

FIG. 5C illustrates a cross-sectional view of an example integrated circuit structure formed in accordance with a subtractive via forming process of the present disclosure. Note that the grain boundaries are not visible in the cross-section shown in FIG. 5C. By using a subtractive via formation process, a single material is etched away to form the vias and the grain boundaries are not visible because of the high crystalline quality of the vias. Thus, the grain boundaries are at least equal to or greater than, the width of the vias. Respectively, the grain boundaries of via 540 is equal to, or greater than, a width of the via 540, and the grain boundaries of via 545 is equal to, or greater than, a width of the via 545.

The subtractive via formation process, as will be appreciated in light of the present disclosure, allows for uniform vias to be formed. As shown, the via material is uniform and the grain boundaries are not visible, as they are essentially (e.g., within 5%) the same size as the width of the via itself. Compare the grain boundaries of FIG. 5C with FIGS. 5A and 5B, where the grain boundaries are visible and are less than the width of the via itself. For example, the grain boundaries can be 50-70% smaller than the width of the via itself. It will be appreciated in light of the present disclosure that the higher crystalline quality, and uniform via structure, allows for spin orbit logic (SOL) and magneto-electro spin orbital (MESO) devices to accurately scale down in size, while ensuring accuracy.

It will be appreciated in light of the present disclosure that the vias may not have a perfectly straight sidewall, as depicted in one or more of the Figures. In some instances, the via may have a tapered shape that goes outward from a top of the via to the bottom of the via, as shown by dotted lines 542 and 543. It will also be appreciated that the via structure may taper inward form a top of the via to the bottom of the via, as shown by the dotted lines 547 and 548.

Use of the techniques and structures provided herein may be detectable using tools such as scanning/transmission electron microscopy (SEM/TEM), composition mapping, x-ray crystallography or diffraction (XRD), secondary ion mass spectrometry (SIMS), time-of-flight SIMS (ToF-SIMS), atom probe imaging or tomography, local electrode atom probe (LEAP) techniques, 3D tomography, high resolution physical or chemical analysis, to name a few suitable example analytical tools. In particular, in some embodiments, such tools may indicate a structure or device configured with a via contact layer having vias formed of single crystalline quality. Such a structure would have a relatively uniform crystal structure, and the grain boundaries of the vias would generally not be visible. Further, the vias would have relatively uniform geometric dimensions with accurate alignment. Numerous detectable structural configurations and variations will be apparent in light of this disclosure.

Example Device—Spin Orbit Logic Device

Figure 6:
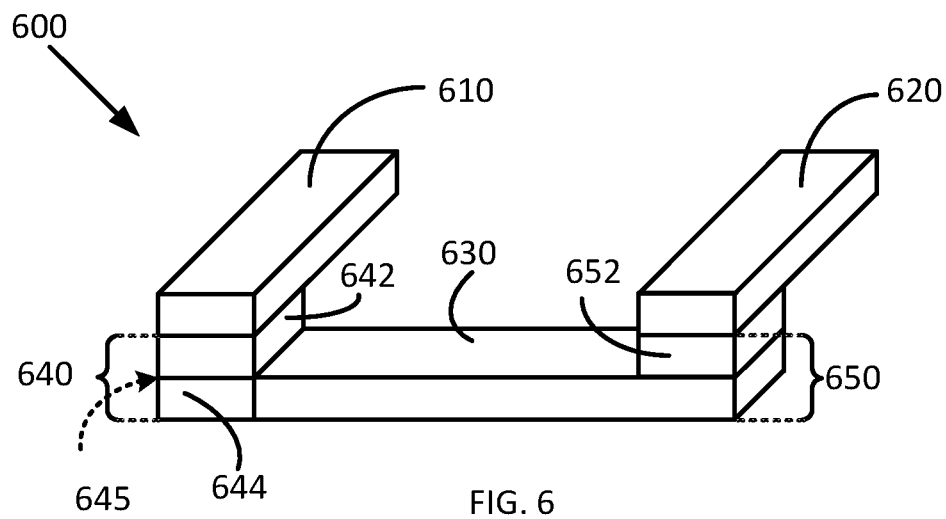
FIG. 6 illustrates an example spin orbit logic (SOL) device, in accordance with an embodiment of the present disclosure.

FIG. 6 illustrates a perspective view of an example spin orbit logic (SOL) device, in accordance with an embodiment of the present disclosure. The spin orbit logic device includes two nanomagnets connected by a channel acting as a charge interconnect. The device 600 includes a magnet 610 and a magnet 620. The magnet 610 is connected to magnet 620 by a channel 630. The magnet 610 is connected to a spin orbit effect stack 640 that includes a non-magnetic material 642 connected to spin orbit coupling material 644. The magnet 610 injects a spin current into the spin orbit effect stack 640. The energy needed to produce the spin current can be provided by a voltage supply connected to the magnet 610. The direction of magnetization of the spin current is determined by a magnetization of the magnet 610. The charge current created at the spin to charge conversion node of the device 600, which is created at the spin orbit effect stack 640, is carried by the interconnect 630. The interconnect 630 is connected at one end to the spin orbit effect stack 640 and to a capacitor 650 at another end. Capacitor 650 defines an output node of the device 600. The charge current carried by interconnect 630 produces a voltage on capacitor 650 including magneto-electric dielectric material 652 in contact with the magnet 620. As the charge accumulates on the magneto-electric capacitor, a strong magneto-electric interaction causes a switching of magnetization in magnet 620.

The magnet 610 and the magnet 620 can each be nano-magnets, in the scale of nanometer size. The magnet 610 and magnet 620 can each be comprised of a ferromagnetic material such as Co, Fe, Ni, Gd, and their alloys, as well as ferromagnets of the Huesler alloy family in the form of X2YZ or XYZ where X, Y, and Z can be elements of Co, Fe, Ni, Al, Ge, Ga, Gd, Mn, etc.

The channel 630 is comprised of an electrically conductive material such as a copper material or 2D conducting channels such as graphene, molybdenum disulfide ($MoS_2$), to name a couple of examples. The interconnect is, for example, comprised of a copper material. The output node 655 includes the interconnect 630 and the magnet 620 as electrical conductors (or plates) separated by a magnetoelectric dielectric material 652, such as bismuth ferrite (BFO), chromium (III) oxide ($Cr_2O_3$) or magnesium oxide (MgO).

The spin orbit effect stack 640, in one embodiment, includes a non-magnetic metal material 642, such as silver (Ag), aluminum (Al), gold (Au), or copper (Cu) connected to spin orbit coupling material 644. The spin orbit coupling material 633 exhibits a spin orbit effect in a metallic system. The spin orbit coupling material 644 can comprise any element of the group I of the periodic table of elements and their alloys (e.g., bismuth, bismuth-silver alloys) or traditional interconnect materials (copper, gold, silver, or aluminum, doped with high atomic weight transition elements that produce a strong or high spin orbit coupling at the interface 645 of the metal material 642 and the spin orbit coupling material 644. The spin orbit coupling material 642 is on the order of 0.01 nanometers (nm) to 100 nm or a bulk material with high spin hall effect (SHE) coefficient, for example on the order of 0.01 to 10 or greater (e.g., 0.1 to 1)) such as tantalum (Ta), tungsten (W), or platinum (Pt), or high atomic weight transition elements such as lutetium (Lu), hafnium (Hf), rhodium (Rf), osmium (Os), iridium (Ir), gold (Au), or mercury (Hg). In one embodiment, the interface 645 can be a high density two-dimensional (2D) electron gas where charge and spin currents are correlated. In an embodiment, there may be a spacer such as a non-magnetic material (e.g., silver or copper) at the top of the spin orbit effect stack 640 (between the stack 640 and the magnet 610).

In operation, a drive or charge current is introduced to magnet 610. The charge current causes a direction of magnetization of magnet 610 to change. A spin current is also created in spin orbit coupling material 644 that creates a transverse charge current in interconnect 630 with a sign of the charge current determined by a direction of magnetization of the magnet 610. The charge current produces a voltage on capacitor 650. The voltage causes a switching of a direction of magnetization of magnet 620, in this example, to coincide with a direction of magnetization of magnet 610.

Note that it is very important for the spin orbit coupling material 644 to be uniform for proper switching to occur. The uniform via structure provided by the subtractive via formation process of the present disclosure provides high crystalline vias with uniform structure for accurate switching in the spin orbit coupling material via.

As shown in FIG. 6, the spin orbit logic device includes vias 642 and 652 which are disposed on the same layer. During fabrication, according to some embodiments, vias of different materials are provided on a same layer, namely the spin orbit coupling material via 642 and magneto-electric dielectric material via 652. The vias can be formed according to an embodiment of the present disclosure to achieve the integrated circuit structure shown in FIG. 6.

Example Device—Spin Orbit Logic Device

Figure 7:
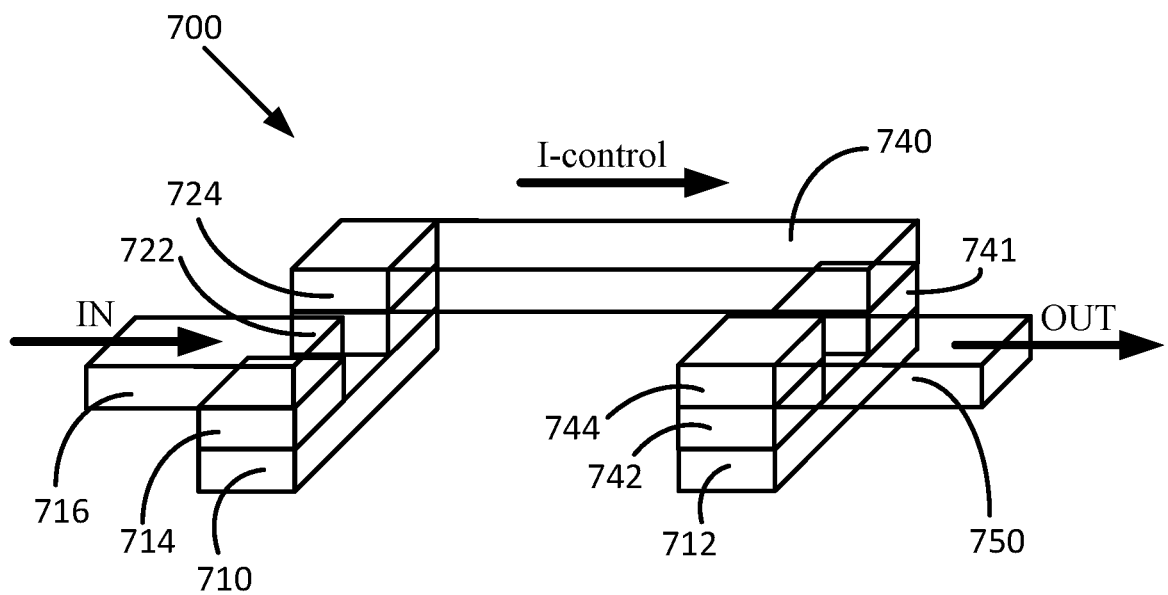
FIG. 7 illustrates another example spin orbit logic (SOL) device, in accordance with an embodiment of the present disclosure.

FIG. 7 illustrates another example spin orbit logic device, in accordance with an embodiment of the present disclosure. In an embodiment, the spin orbit logic device 700 acts as a repeater. The spin orbit logic device 700 includes a magnet 710 and a magnet 712. Deposited on a surface of the magnet 710 at one end is magneto-electric material 714, and at another end, spin orbit effect stack comprised of via 722 and spin orbit coupling material 724. Deposited on a surface of magnet 712 at one end is spin orbit effect stack (via 742 and spin orbit coupling material 744) and, at another end, magneto-electric material 741. Interconnect 740 is connected between the spin orbit effect stack (via 722 and spin orbit coupling material 724) of the magnet 710 and the magneto-electric material 741 of the magnet 712. The interconnect 716 is connected to magneto-electric material 714 on magnet 710 and interconnect 750 is connected to spin orbit effect stack (via 742 and spin orbit coupling material 744) on magnet 712.

When the spin orbit logic device 700 is "on" (i.e., drive current is flowing, as shown by the arrow IN), the device functions as a repeater representatively receiving an input on interconnect 716 and a charge current is repeated on interconnect 750. Such input current produces a drive current (spin current) in magnet 710 that is converted to a charge current in interconnect 740 that controls the direction of magnetization of magnet 710 (as shown by arrow I-control). The power to turn "on" the device 700 can, for example, be controlled with another spin orbit logic device (not shown) coupled to the interconnect 716.

As shown in the structure of FIG. 7, the resulting spin orbit logic device 700 includes four vias (interconnects) 714, 722, 741, and 742, on a same layer (i.e., extending along a same horizontal plane) of the structure. The interconnect 714 is formed of a different material than interconnect 722, and the interconnects 714 and 722 are disposed on a same layer above the magnet 710. Likewise, the interconnects 741 is formed of a different material than interconnect 742, and interconnects 741 and 742 disposed on a same layer above the magnet 712.

Example Device—Magneto-Electric Spin Orbital (MESO) Device

Figure 8:
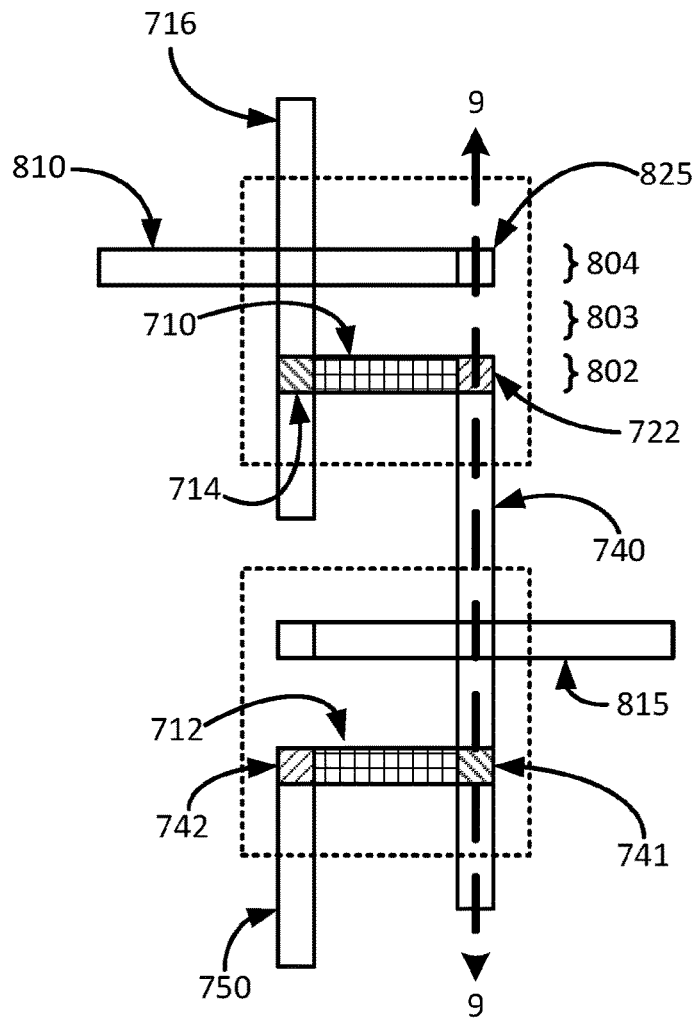
FIG. 8 illustrates an example meso-electronic spin orbital (MESO) device, in accordance with an embodiment of the present disclosure.
Figure 9:
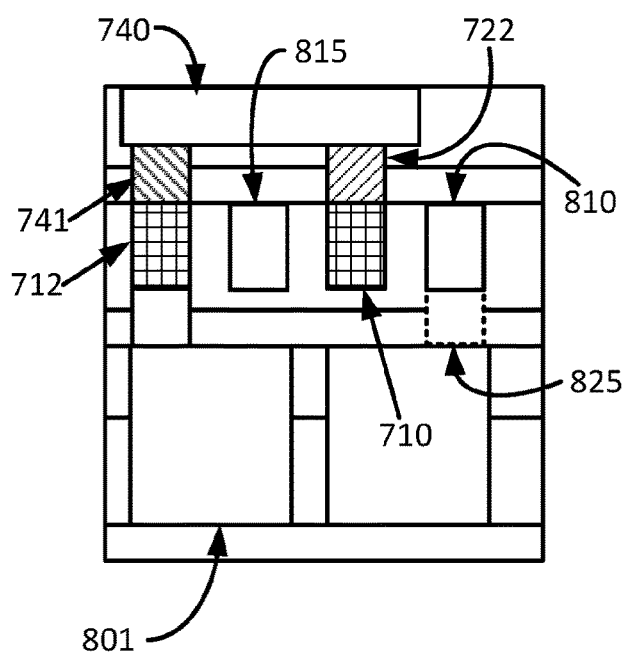
FIG. 9 illustrates a cross-sectional view as taken parallel to a source region of the device of FIG. 8.

FIG. 8 illustrates an example meso-electronic spin orbital (MESO) device, in accordance with an embodiment of the present disclosure. FIG. 9 illustrates a cross-sectional view as taken parallel to a source region of the device of FIG. 8, as taken along line 9-9 of FIG. 8.

The MESO device includes two transistor components, a first transistor having a junction region 802, junction region 803, and junction region 804, and a second transistor having a junction region 806, junction region 807, and junction region 808. As shown, the MESO device includes a first magnet 710 in junction region 802, and a second magnet 712 in junction region 806. The first magnet 710 has a via 714 on one end and a via 722 on the opposite end. The via 714 can be the magneto-electric material via, and the via 722 can be the spin orbit coupling material. The second magnet 712 has a via 741 on one end and a via 742 on the opposite end. The via 741 can be the magneto-electric material via, and the via 742 can be the spin orbit coupling material. A metal interconnect 810 is connected to junction region 802, which can be a drain region, and metal interconnect line 716 is connected to junction region 804, for example through via 825, which can be a source region. The metal interconnect 740 is connected to the junction region 802 and the junction region 806. The metal interconnect 815 is connected to junction region 808.

The junction region 802 includes the magnet 710 connected at one end to magneto-electric material 714 and at opposite end to spin orbit effect material 722. The junction region 806 includes the magnet 712 connected at one end to magneto-electric material 741 and at opposite end to spin orbit effect material 742. The junction region 802 can be a source region, the junction region 803 can be a gate region, and the junction region 804 can be a drain region for a transistor. The junction region 806 can be a source region, the junction region 807 can be a gate region, and the junction region 808 can be a drain region for a transistor.

In operation, a charge current introduced on the interconnect line 716 switches a direction of magnetization of the magnet 710 and injects a spin current into the magnet 710. The spin current injected into the magnet 710 is converted to a charge current in the interconnect 740 that switches the direction of magnetization of the magnet 712.

It will be appreciated in light of the present disclosure that, for example as shown in FIG. 9, the placement and positioning of the vias 722 and 741 within the integrated circuit structure facilitate proper operation of the integrated circuit structure, according to some embodiments. The proper placement of the vias ensures that there is proper connectivity between the magnet, the interconnect, and the underlying source and drain regions. For example, as shown in FIG. 9, the via 741 is positioned precisely above the magnet 712 and above the source region 910. The device of FIGS. 6-9 provide example devices that implement the via contact layer fabricated according to the techniques of the present disclosure. It will be appreciated that other devices can implement the techniques of the present disclosure.

Although the foregoing describes forming two vias of different materials on a single via contact layer, it will be appreciated in light of the present disclosure that the techniques herein are likewise applicable to other integrated circuit structure formation techniques. The techniques can be applicable to any via formation process, or other component formation process, where different materials are needed on a same layer, or to a via formation process that utilizes a single material also. For example, with reference to FIG. 9, the interconnects 810, 815 and magnets 710, 712 could be deposited according to the techniques herein using a checkerboard pattern as a sacrificial layer to precisely locate the desired interconnections. Likewise, the techniques herein can be applicable to more than two different materials, such as three, four, or more materials, by repeating the process three, four, or more times, as will be appreciated in light of the present disclosure.

Example System

Figure 10:
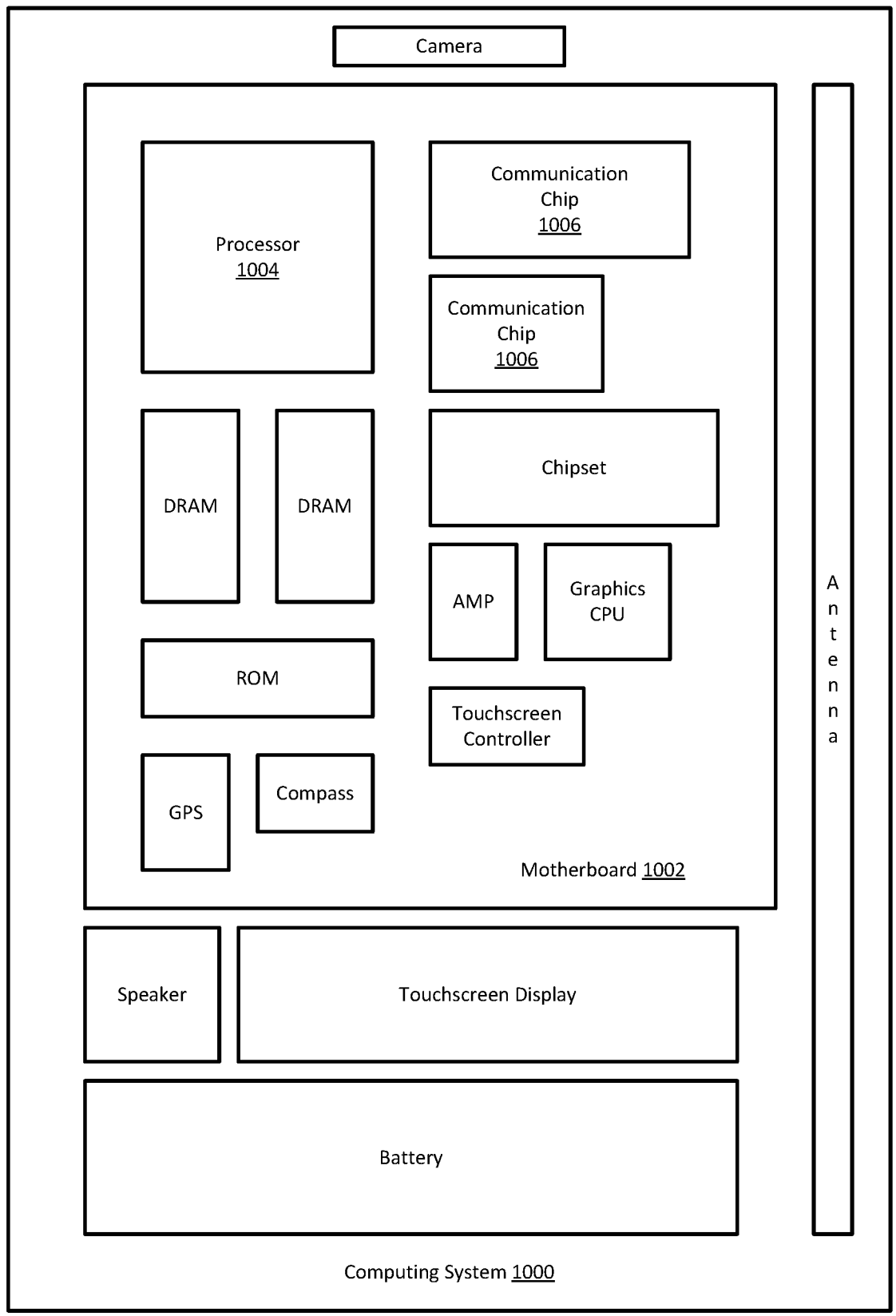
FIG. 10 illustrates a computing system implemented with integrated circuit structures or devices formed using the techniques disclosed herein, in accordance with some embodiments of this disclosure.

FIG. 10 illustrates a computing system 1000 implemented with one or more integrated circuit structures or devices formed using the techniques disclosed herein, in accordance with some embodiments of this disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices configured with fins formed as variously provided herein, in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices configured with fins formed as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices configured with fins formed as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices configured with fins formed as variously described herein.

Note that reference herein to structural features such as a top and a bottom may generally refer to top or bottom surfaces that undulate within a tolerance (e.g., such as a surface that has a distance between its highest and lowest points of 2 nm or less, but is not perfectly flat). To this end, such reference to top or bottom of a given structure is not intended to be limited to a true top or bottom that is some specific point along a top or bottom surface of the structure, but instead refers to an overall or macro top or bottom surface, as will be appreciated. In addition, a sidewall as used herein generally refers to a downward trending surface that is lower than or otherwise a suitable distance from a lowest point of a top surface. Similarly, a sidewall as used herein may also generally refer to an upward trending surface that is higher than or otherwise a suitable distance from a highest point of a bottom surface. So, for instance, if the top surface of a given structure is a point, then the sidewall of that structure is the downward trending surface extending downward from that point, or more specifically, the downward trending surface that is 1 nm or more lower than that point, for example. Likewise, if the top surface of a given structure is a flat but undulating surface, then the sidewall of that structure is the downward trending surface extending downward from that undulating surface, or more specifically, the downward trending surface that is 1 nm or more lower than the lowest point of that undulating surface, for example.

Further note that reference herein to structural features such as width and height may generally refer to dimensions that vary in value, depending on where they are measured on the given structure. For instance, if a top surface of a structure undulates between high and low points rather than being perfectly flat, the height of that structure may vary depending on where it is measure relative. In any such cases, a width or height can be measured, for example, as an average value of multiple width or height measurements for a given surface, or a median value of multiple width or height measurements for a given surface, or some other statistically relevant representation of the height or width or other dimension of interest. In some cases, a width of a structure can be measured as an intermediate or midway point between the macro top and bottom surfaces of that structure. Likewise, a height of a structure can be measured as an intermediate or midway point between the sidewalls of that structure.

Any number of additional processes may be performed to complete the formation of one or more transistor devices, such as forming a gate stack (dummy and final gate stacks, depending on process used), source/drain regions, source/drain contacts, and performing back-end-of line interconnections (e.g., metal layers M1 through M9), for example. A standard or custom MOS transistor formation process flow may be used.

Numerous benefits will be apparent in light of this disclosure. For example, in some embodiments, the techniques provide a uniform, high quality crystalline for the via. A via accordingly has grain boundaries that are not visible, for example, under transmission electron microscopy. Apply the checkerboard pattern allows the vias to be precisely positioned win a layer at a correct location and having the correct critical dimensions within the overall integrated circuit structure. Thus, vias can be accurately aligned within the integrated circuit structure as the size of the via scales down, for example, to less than or equal to 7 nm.

FURTHER EXAMPLE EMBODIMENTS

The following examples pertain to further embodiments, from which numerous permutations and configurations will be apparent.

Example 1 includes an integrated circuit structure comprising a via contact layer, the via contact layer including a first metal via and a second metal via, wherein the first metal via comprises a first material, and wherein the second metal via comprises a second material, wherein the first material is different than the second material; and wherein a width of a grain size of the first material of the first metal via is greater than or equal to a width of the first metal via, and wherein a width of a grain size of the second material of the second metal via is greater than or equal to a width of the second metal via.

Example 2 includes the subject matter of Example 1, wherein the width of the grain size of the first material is greater than or equal to the width of the first metal via when viewed in cross-section under transmission electron microscopy.

Example 3 includes the subject matter of Example 1 or 2, wherein the first material of the first metal via comprises at least one of silver, aluminum, gold, copper, tantalum, tungsten, platinum, lutetium, hafnium, rhodium, osmium, iridium, and mercury.

Example 4 includes the subject matter of any one of Examples 1 through 3, wherein the second material of the second metal via comprises at least one of bismuth ferrite, chromium (III) oxide, and magnesium oxide.

Example 5 includes the subject matter of any one of Examples 1 through 4, wherein the first material of the first metal via comprises at least one of silver, aluminum, gold, copper, tantalum, tungsten, platinum, lutetium, hafnium, rhodium, osmium, iridium, and mercury, and wherein the second material of the second metal via comprises at least one of bismuth ferrite, chromium (III) oxide, and magnesium oxide.

Example 6 includes the subject matter of any one of Examples 1 through 5, further comprising an etch stop layer on or above a substrate.

Example 7 includes the subject matter of Example 6, wherein the etch stop layer comprises a metal material.

Example 8 includes the subject matter of any one of Examples 1 through 7, wherein the via contact layer is a first via contact layer, and the integrated circuit structure further comprises a second via contact layer and a second metal layer on the second via contact layer, such that the second via layer is between the substrate and the second metal layer.

Example 9 includes the subject matter of any one of Examples 1 through 8, wherein the first via contact layer further comprises a third metal via comprised of a same material as the first metal via, and a fourth metal via comprised of a same material as the second metal via.

Example 10 includes the subject matter of any one of Examples 1 through 9, wherein a grain boundary of the first material of the first metal via is not visible when viewed in cross-section under transmission electron microscopy.

Example 11 includes the subject matter of any one of Examples 1 through 10, wherein the first metal via of the via contact layer is formed by depositing a layer of the first material, depositing an etch stop layer, applying a first sacrificial layer in a checkerboard pattern on the etch stop layer, selectively removing at least one region of the first sacrificial layer to reveal at least one opening, and etching areas of the layer of the first material through the at least one opening in the checkerboard pattern layer to thereby form the first metal via.

Example 12 includes the subject matter of Example 11, wherein the second metal via is formed by depositing a layer of the second material, depositing a second etch stop layer, applying a second sacrificial layer in a checkerboard pattern on the second etch stop layer, selectively removing at least one region of the second sacrificial layer to reveal at least one opening, and etching areas of the layer of the second material through the at least one opening in the second sacrificial layer to thereby form the second metal via.

Example 13 includes the subject matter of Example 11 or 12, wherein selectively removing the one or more regions of the checkerboard pattern layer is performed using lithography.

Example 14 includes the subject matter of any one of Examples 11 through 13, wherein a first sacrificial material of the first sacrificial layer comprises a first organic material having a first resistance and a second sacrificial material of the sacrificial layer comprises a second organic material having a second resistance greater than the first resistance.

Example 15 includes a magneto-electric spin orbit (MESO) device having the subject matter of any one of Examples 1 through 10.

Example 16 includes a method of forming vias for an integrated circuit structure, the method comprising depositing a first layer that comprises a first material on or above a substrate; depositing an etch stop layer on the first layer; depositing a first sacrificial layer comprising a first sacrificial material and a second sacrificial material deposited in a first checkerboard pattern on the etch stop layer; removing one or more regions of the first sacrificial layer where it is not desired to have any vias in the first layer underlying the first sacrificial layer; etching away areas of the first layer through the regions of the first sacrificial layer that have been removed, thereby forming one or more first vias of the first material; depositing a second layer that comprises a second material, the second material being different than the first material; depositing a second etch stop layer on the second layer; depositing a second sacrificial layer comprising a third sacrificial material and a fourth sacrificial material deposited in a second checkerboard pattern on the second etch stop layer; removing one or more regions of the second layer where it is not desired to have any vias in the second layer underlying the second sacrificial layer; and etching away areas of the second layer through the one or more regions of the second sacrificial layer that have been removed, thereby forming one or more second vias of the second material on a same layer as the one or more first vias formed of the first material. In some such example cases, the second material is different than the first material.

Example 17 includes the subject matter of Example 16, and further comprises depositing a first plurality of spacers on the etch stop layer prior to depositing the first sacrificial layer.

Example 18 includes the subject matter of Example 16 or 17, further comprising depositing a second plurality of spacers on the second etch stop layer prior to depositing the second sacrificial layer.

Example 19 includes the subject matter of any one of Examples 16 through 18, wherein removing one or more regions of the first sacrificial layer is performed by extreme ultraviolet (EUV) lithography.

Example 20 includes the subject matter of any one of Examples 16 through 19, further comprising depositing a bottom etch stop layer on or above the substrate; and depositing the first layer on the bottom etch stop layer.

Example 21 includes the subject matter of any one of Examples 16 through 20, wherein depositing the first layer is performed by lithography.

Example 22 includes the subject matter of any one of Examples 16 through 21, wherein the first material is a spin orbit coupling material, and the second material is a functional oxide material.

Example 23 includes the subject matter of any one of Examples 16 through 22, wherein depositing the etch stop layer comprises at least one of epitaxial deposition and chemical vapor deposition.

Example 24 includes the subject matter of any one of Examples 16 through 23, further comprising depositing a dielectric material over and around the first vias and the second vias.

Example 25 includes the subject matter of any one of Examples 16 through 24, wherein the etching is performed using an etchant comprising at least one of hydrochloric acid, hydrofluoric acid, and nitric acid.

Example 26 includes the subject matter of any one of Examples 16 through 25, wherein the first material is comprised of a same material as the third material and the second material is comprised of a same material as the fourth material.

Example 27 includes the subject matter of any one of Examples 16 through 26, wherein, when taken in cross-section under transmission electron microscopy, grain boundaries of the first vias of the first material and grain boundaries of the second vias of the second material are not visible.

Example 28 includes the subject matter of any one of Examples 16 through 27, wherein the first material of the first via has a grain size that is greater than or equal to a width of the first metal via.

Example 29 includes a method of forming vias for an integrated circuit structure, the method comprising depositing a first layer on or above a substrate, the first layer comprised of a dielectric material; depositing an etch stop layer on the first layer; depositing a first sacrificial layer comprising a first sacrificial material and a second sacrificial material in a first checkerboard pattern; removing regions of the first sacrificial layer where it is desired to have vias of a first material; etching first openings in the dielectric material; filling the first openings with the first material, thereby forming at least one via of the first material; depositing a second sacrificial layer comprising a third sacrificial material and a fourth sacrificial material in a second checkerboard pattern; removing regions of the second sacrificial layer where it is desired to have vias of a second material, the second material being different than the first material; etching second openings in the dielectric material; and filling the second openings with the second material, thereby forming at least one via of the second material on a same layer as the at least one via of the first material. In some such example cases, the second material is different than the first material. As used herein, a first material is different from a second material when the composition of the first material is different from the composition of the second material. In one such example case, a first material is different from a second material when at least one component of the first material is not present in the second material.

Example 30 includes the subject matter of Example 29, and further includes depositing a plurality of spacers on the etch stop layer prior to depositing the first sacrificial layer.

Example 31 includes the subject matter of Example 29 or 30, wherein the first material is a spin orbit coupling material, and the second material is a functional oxide material.

Example 32 includes the subject matter of any one of Examples 29 through 31, wherein first material comprises at least one of silver, aluminum, gold, copper, tantalum, tungsten, platinum, lutetium, hafnium, rhodium, osmium, iridium, and mercury, and wherein the second material comprises at least one of bismuth ferrite, chromium (III) oxide, and magnesium oxide.

Example 33 includes the subject matter of any one of Examples 29 through 32, wherein the first sacrificial material and the third sacrificial material are formed of a same material, and the second sacrificial material and the fourth sacrificial material are formed of a same material.

Example 34 includes the subject matter of any one of Examples 29 through 33, wherein, when taken in cross-section under transmission electron microscopy, grain boundaries of the first via and the second via are visible.

Example 35 includes the subject matter of any one of Examples 29 through 34, wherein, when taken in cross-section under transmission electron microscopy, a first grain size of the first material is less than a width of vias of the first material, and a second grain size of the second material is less than a width of vas of the second material.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit structure comprising:
   a via contact layer, the via contact layer including a first via and a second via, wherein the first via comprises a first conductive material, and wherein the second via comprises a second conductive material, wherein the first conductive material is different than the second conductive material; and
   wherein a width of a grain size of the first conductive material of the first via is greater than or equal to a width of the first via, and wherein a width of a grain size of the second conductive material of the second via is greater than or equal to a width of the second via.

2. The integrated circuit structure of claim 1, wherein the first conductive material of the first via comprises at least one of silver, aluminum, gold, copper, tantalum, tungsten, platinum, lutetium, hafnium, rhodium, osmium, iridium, and mercury.

3. The integrated circuit structure of claim 1, wherein the second conductive material of the second via comprises at least one of bismuth ferrite, chromium (III) oxide, and magnesium oxide.

4. The integrated circuit structure of claim 1, wherein the first conductive material of the first via comprises at least one of silver, aluminum, gold, copper, tantalum, tungsten, platinum, lutetium, hafnium, rhodium, osmium, iridium, and mercury, and wherein the second conductive material of the second via comprises at least one of bismuth ferrite, chromium (III) oxide, and magnesium oxide.

5. The integrated circuit structure of claim 1, further comprising:
   a first conductive line below the via contact layer and in contact with the first and second vias; and
   a second conductive line above the via contact layer and in contact with the second via;
   wherein the first conductive line is perpendicular to the second conductive line.

6. The integrated circuit structure of claim 5, wherein the first conductive material of the first via comprises at least one of silver, aluminum, gold, copper, tantalum, tungsten, platinum, lutetium, hafnium, rhodium, osmium, iridium, and mercury, and wherein the second conductive material of the second via comprises at least one of bismuth ferrite, chromium (III) oxide, and magnesium oxide.

7. The integrated circuit structure of claim 1, wherein a grain boundary of the first conductive material of the first via is not visible when viewed in cross-section under transmission electron microscopy.

8. The integrated circuit structure of claim 1, wherein the first conductive material of the first via comprises silver, and wherein the second conductive material of the second via comprises bismuth ferrite.

9. The integrated circuit structure of claim 1, wherein the first conductive material of the first via comprises a non-magnetic material, and wherein the second conductive material of the second via comprises a magneto-electric material.

10. A magneto-electric spin orbit (MESO) device having the integrated circuit structure of claim 1.

11. An integrated circuit structure comprising:
    a first layer including a first conductive line and a second conductive line;
    a second layer including a third conductive line, the third conductive line perpendicular to the first and second conductive lines; and
    a third layer between the first and second layers, the third layer including a first via and a second via, wherein the first via is between the first and third conductive lines and comprises a first conductive material, and wherein the second via is between the second and third conductive lines and comprises a second conductive material, wherein the first conductive material is different than the second conductive material, wherein the first conductive material comprises a non-magnetic material, and wherein the second conductive material comprises a magneto-electric material;
    wherein a width of a grain size of the first conductive material of the first via is greater than or equal to a width of the first via, and/or wherein a width of a grain size of the second conductive material of the second via is greater than or equal to a width of the second via.

12. The integrated circuit structure of claim 11, wherein the first conductive material of the first via comprises at least one of silver, aluminum, gold, copper, tantalum, tungsten, platinum, lutetium, hafnium, rhodium, osmium, iridium, and mercury, and wherein the second conductive material of the second via comprises at least one of bismuth ferrite, chromium (III) oxide, and magnesium oxide.

13. The integrated circuit structure of claim 11, wherein a grain boundary of the first conductive material of the first via is not visible when viewed in cross-section under transmission electron microscopy.

14. The integrated circuit structure of claim 11, wherein the first conductive material of the first via comprises silver, and wherein the second conductive material of the second via comprises bismuth ferrite.

15. A magneto-electric spin orbit (MESO) device having the integrated circuit structure of claim 11.

16. An integrated circuit structure comprising:
    a first layer including a first conductive line and a second conductive line, wherein the first and second conductive lines are magnets;

a second layer including a third conductive line, the third conductive line perpendicular to the first and second conductive lines; and a third layer between the first and second layers, the third layer including a first via and a second via, wherein the first via is between the first and third conductive lines and comprises a first conductive material, and wherein the second via is between the second and third conductive lines and comprises a second conductive material, wherein the first conductive material is different than the second conductive material, wherein the first conductive material comprises a non-magnetic material, and wherein the second conductive material comprises a magneto-electric material;

wherein a width of a grain size of the first conductive material of the first via is greater than or equal to a width of the first via, and/or wherein a width of a grain size of the second conductive material of the second via is greater than or equal to a width of the second via.

17. The integrated circuit structure of claim 16, wherein the first conductive material of the first via comprises at least one of silver, aluminum, gold, copper, tantalum, tungsten, platinum, lutetium, hafnium, rhodium, osmium, iridium, and mercury, and wherein the second conductive material of the second via comprises at least one of bismuth ferrite, chromium (III) oxide, and magnesium oxide.

18. The integrated circuit structure of claim 16, wherein a grain boundary of the first conductive material of the first via is not visible when viewed in cross-section under transmission electron microscopy.

19. The integrated circuit structure of claim 16, wherein the first conductive material of the first via comprises silver, and wherein the second conductive material of the second via comprises bismuth ferrite.

20. A magneto-electric spin orbit (MESO) device having the integrated circuit structure of claim 16.

* * * * *